(12) United States Patent
Kang et al.

(10) Patent No.: US 11,279,633 B2
(45) Date of Patent: Mar. 22, 2022

(54) SYSTEM AND METHOD FOR PLASMA DISCHARGE IN LIQUID

(71) Applicant: Onvector LLC, King of Prussia, PA (US)

(72) Inventors: Jun Kang, Cherry Hill, NJ (US); Daniel J. Cho, Philadelphia, PA (US); HyoungSup Kim, Brookhaven, PA (US)

(73) Assignee: Onvector LLC, King of Prussia, PA (US)

( * ) Notice: Subject to any disclaimer, the term of this patent is extended or adjusted under 35 U.S.C. 154(b) by 382 days.

(21) Appl. No.: 16/258,734

(22) Filed: Jan. 28, 2019

(65) Prior Publication Data

US 2019/0241447 A1    Aug. 8, 2019

Related U.S. Application Data

(63) Continuation-in-part of application No. 15/511,425, filed as application No. PCT/US2015/050137 on Sep. 15, 2015, now Pat. No. 10,793,447.
(Continued)

(51) Int. Cl.
*C02F 1/46* (2006.01)
*C02F 1/32* (2006.01)
(Continued)

(52) U.S. Cl.
CPC ............ *C02F 1/4608* (2013.01); *C02F 1/325* (2013.01); *C02F 1/725* (2013.01);
(Continued)

(58) Field of Classification Search
CPC ...... C02F 1/46; C02F 1/32; C02F 1/72; C02F 1/30; H01J 37/32; H05H 1/48
See application file for complete search history.

(56) References Cited

U.S. PATENT DOCUMENTS 3,098,292 A    7/1963    Tibor
3,760,145 A    9/1973    Wolf et al.
(Continued)

FOREIGN PATENT DOCUMENTS

| WO | WO-2005000366 A2 * | 1/2005 | ............... A61L 2/14 |
|---|---|---|---|
| WO | WO-2009006993 A2 * | 1/2009 | ............ C02F 1/4608 |
| WO | WO-2014108659 A1 | 7/2014 | |

OTHER PUBLICATIONS

Ahmadun et al., "Review of technologies for oil and gas produced water treatment," Journal of Hazardous Materials, vol. 170, pp. 530-551, 2009.
(Continued)

*Primary Examiner* — Walter D. Griffin
*Assistant Examiner* — Cameron J Allen
(74) *Attorney, Agent, or Firm* — Mintz Levin Cohn Ferris Glovsky and Popeo, P.C.

(57) ABSTRACT

A system for generating a plasma discharge in liquid utilizes first and second electrodes spaced apart in an interior space of a vessel holding the liquid. A channel can be defined in certain embodiments at least partially by at least one of the first and second electrodes, and an inlet in fluid communication with the interior space is configured to generate a vortical fluid flow in the vessel. A method for generating a plasma discharge in liquid is also provided.

25 Claims, 17 Drawing Sheets

Related U.S. Application Data

(60) Provisional application No. 62/050,369, filed on Sep. 15, 2014.

(51) Int. Cl.
    *C02F 1/72*     (2006.01)
    *H01J 37/32*     (2006.01)
    *C02F 103/10*     (2006.01)

(52) U.S. Cl.
    CPC .. *H01J 37/32055* (2013.01); *H01J 37/32568* (2013.01); *C02F 2103/10* (2013.01); *C02F 2301/026* (2013.01); *C02F 2305/10* (2013.01)

(56) References Cited

U.S. PATENT DOCUMENTS

| | | | |
|---|---|---|---|
| 10,793,447 B2 | 10/2020 | Kang | |
| 2008/0099406 A1 | 5/2008 | Ruan et al. | |
| 2010/0219136 A1 | 9/2010 | Campbell et al. | |
| 2011/0031124 A1 | 2/2011 | Hana | |
| 2011/0062014 A1* | 3/2011 | Gutsol | C01B 3/342 |
| | | | 204/164 |
| 2011/0250098 A1 | 10/2011 | Matveev | |
| 2013/0299351 A1 | 11/2013 | Livshitz et al. | |
| 2014/0054242 A1 | 2/2014 | Imai | |
| 2014/0210344 A1 | 7/2014 | Foret | |
| 2015/0225264 A1* | 8/2015 | Fujikane | C02F 1/4608 |
| | | | 210/748.17 |
| 2015/0251933 A1 | 9/2015 | Nakamura et al. | |
| 2015/0307370 A1 | 10/2015 | Kang | |
| 2016/0074829 A1 | 3/2016 | Kitano et al. | |

OTHER PUBLICATIONS

Czernichowski et al., "Spectral and electrical diagnostics of gliding arc," Acta Physica Polonica—Series A General Physics, vol. 89, pp. 595-604, 1996.

Guo et al., "Structure of nanocarbons prepared by arc discharge in water," Materials Chemistry and Physics, vol. 105(2): pp. 175-178, 2007.

Kim et al., "Concentration of hydrogen peroxide generated by gliding arc discharge and inactivation of *E. coli* in water," Int. Comm. Heat & Mass Trnsfer, v. 42, p. 5-10, 2013.

Kim et al., "Residual Effects and energy cost of Gliding Arc Discharge Treatment on the inactivation of *E. coli* in water," Int. J. Heat & Mass Trnsfer, 77: pp. 1075-1083, 2014.

Kim et al., "Use of plasma gliding arc discharge on the inactivation of *E. coli* in Water," Separation and Purification Technology, vol. 120, pp. 423-428, 2013.

Lange et al., "Nanocarbon production by arc discharge in water," Carbon, vol. 41(8): pp. 1617-1623, 2003.

Maksimov et al., "Electrolyte-as-cathode glow discharge . . . of solution-to-plasma transport of neutral and charged species," High Energy Chemistry, v. 38(3): p. 196-199, 2004.

McIntyre et al., "Uses of ultraviolet/ozone for hydrocarbon removal: Applications to surfaces of complex composition or geometry," JVST A, vol. 9, pp. 1355-1359, 1991.

Mezei et al., "Electrolyte cathode atmospheric glow discharges for direct solution analysis," Applied Spectroscopy Reviews, vol. 42(6): pp. 573-604, 2007.

Munson et al., "Fundamentals of Fluid Mechanics," Table of Contents. 7th ed. New York: John Wiley & Sons, Inc, 2013 (8 pages).

Mutaf-Yardimci, et al., "Thermal and nonthermal regimes of gliding arc discharge in air flow," Journal of Applied Physics, vol. 87, pp. 1632-1641, 2000.

Sano et al., "Properties of carbon onions produced by an arc discharge in water," Journal of Applied Physics, vol. 92(5): pp. 2783-2788, 2002.

Snoeyink et al., "Water Chemistry." Table of Contents. New York: John Wiley, 1980 (8 pages).

Wright et al., "New Fouling Prevention Method using a Plasma Gliding Arc for Produced Water Treatment," Desalination, vol. 345: pp. 64-71, 2014.

Yang et al., "Mineral Fouling Control by Underwater Plasma Discharge in a Heat Exchanger," ASME Journal of Heat Transfer, vol. 133, p. 054502, 2011.

Yang et al., "Removal of CaCO3 scales on a filter membrane using plasma discharge in water," Int. J. Heat Mass Transfer, vol. 52, pp. 4901-4906, 2009.

* cited by examiner

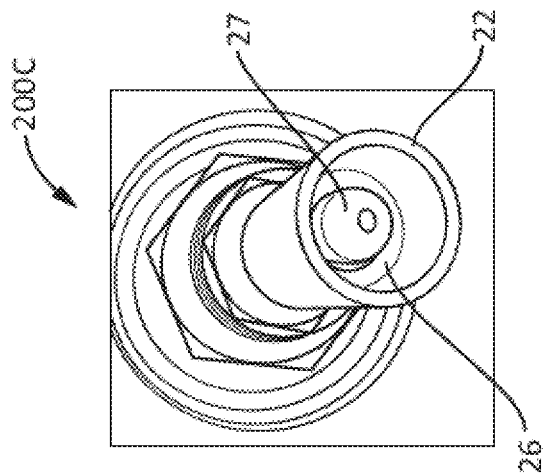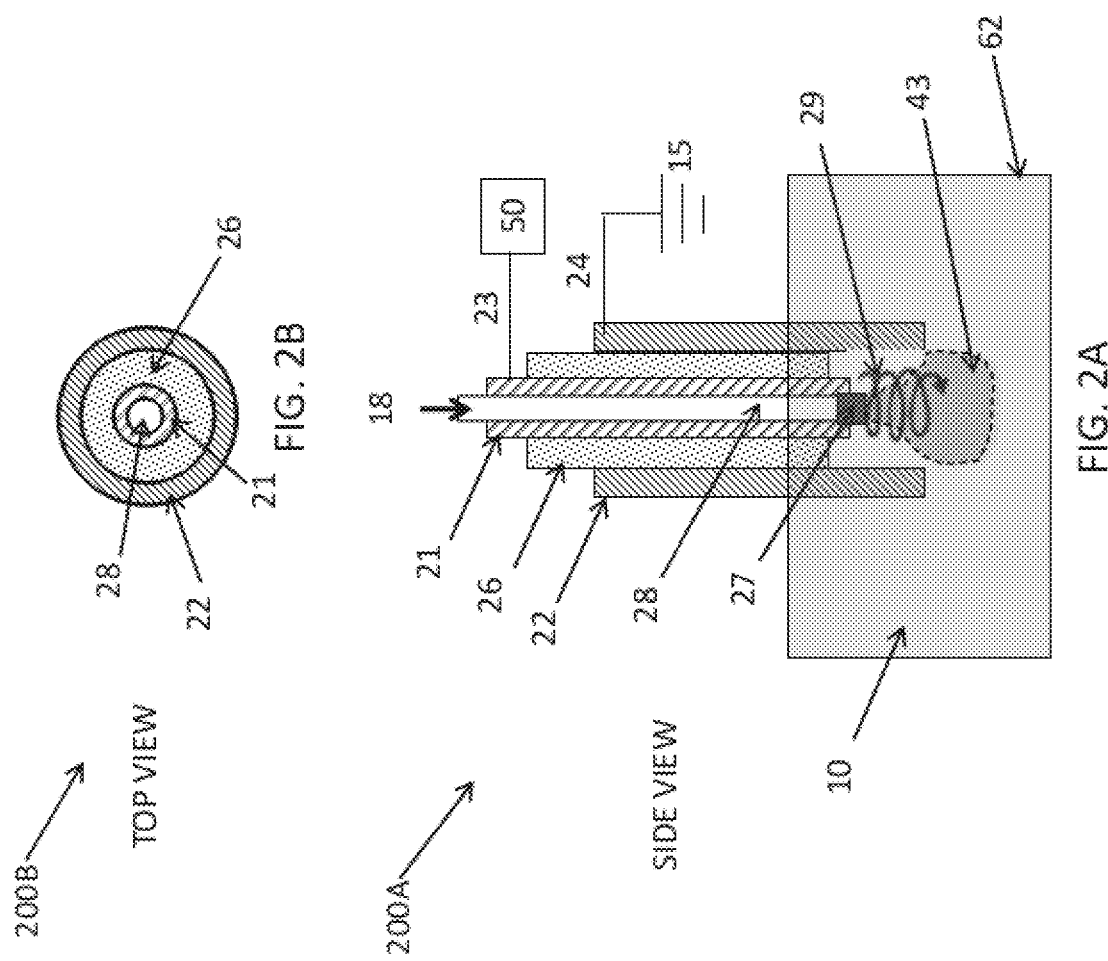

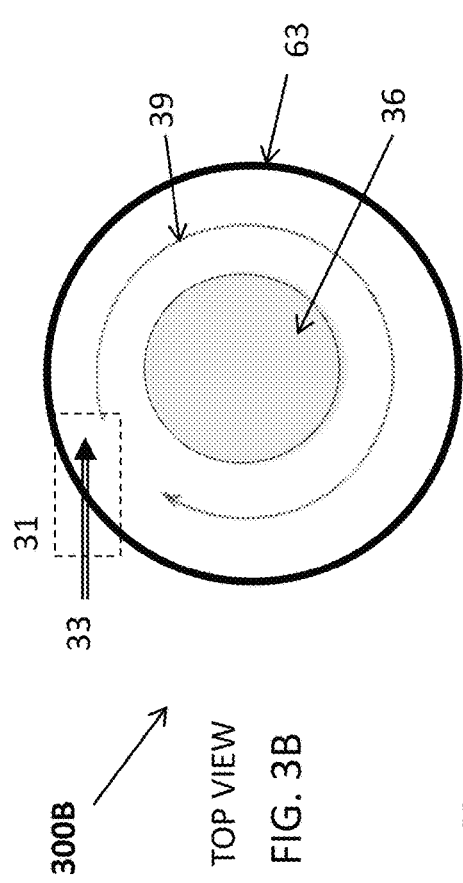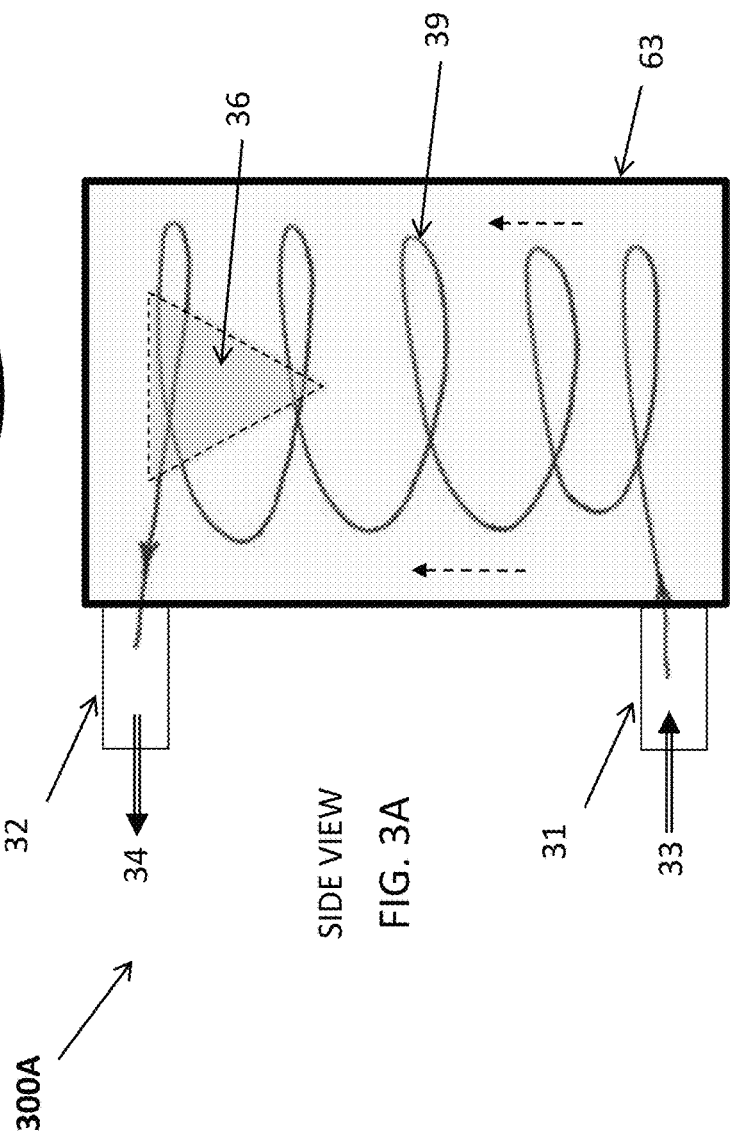

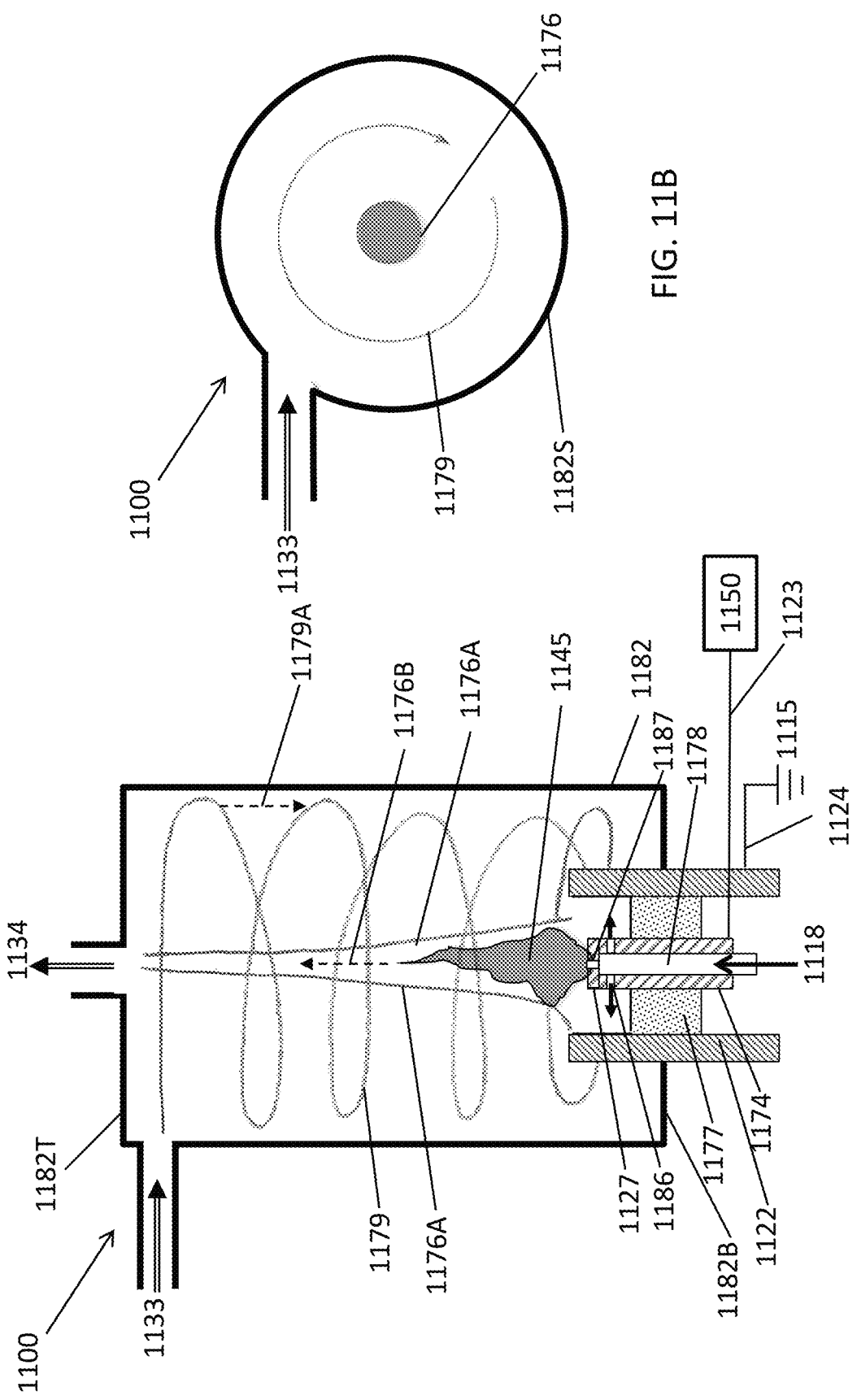

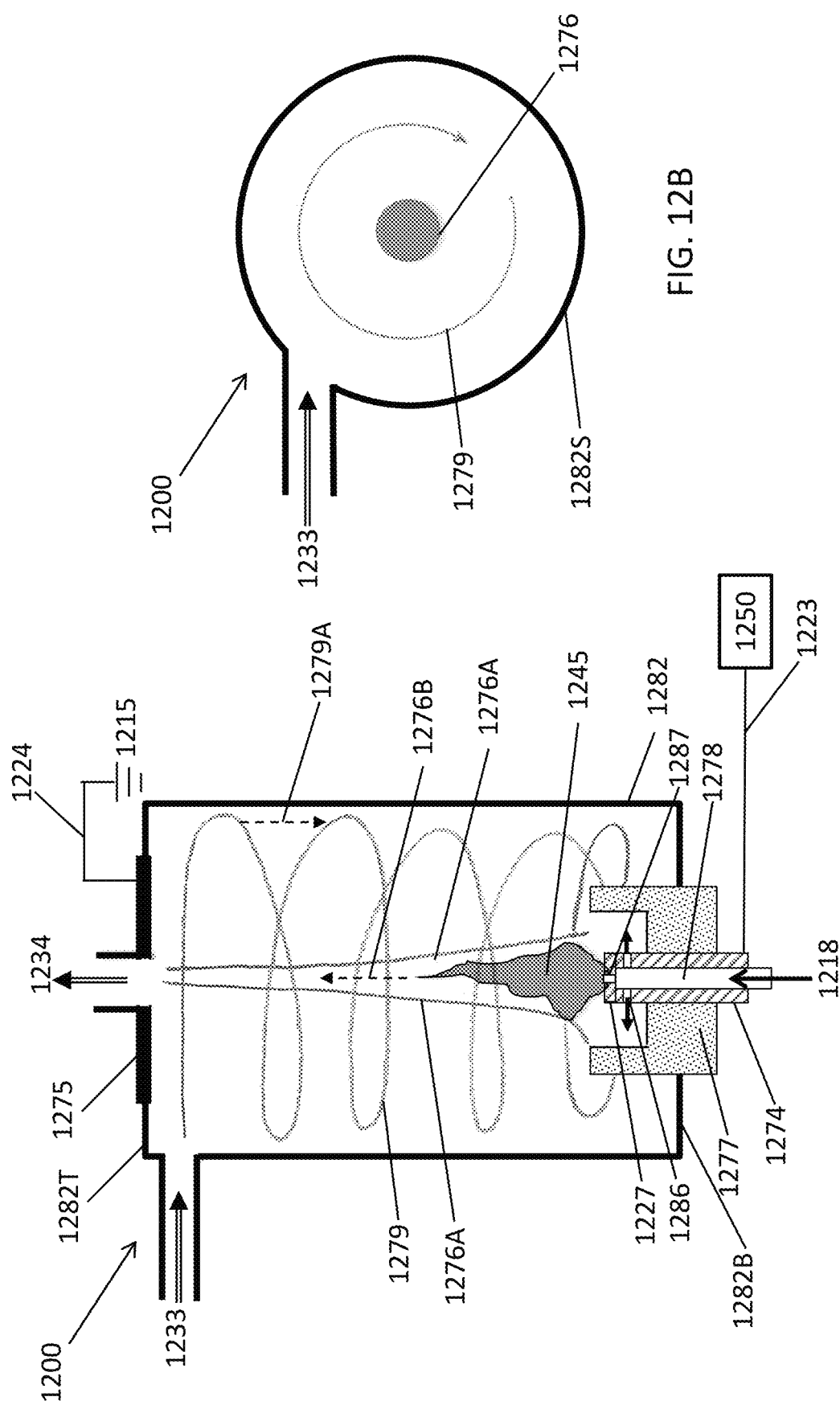

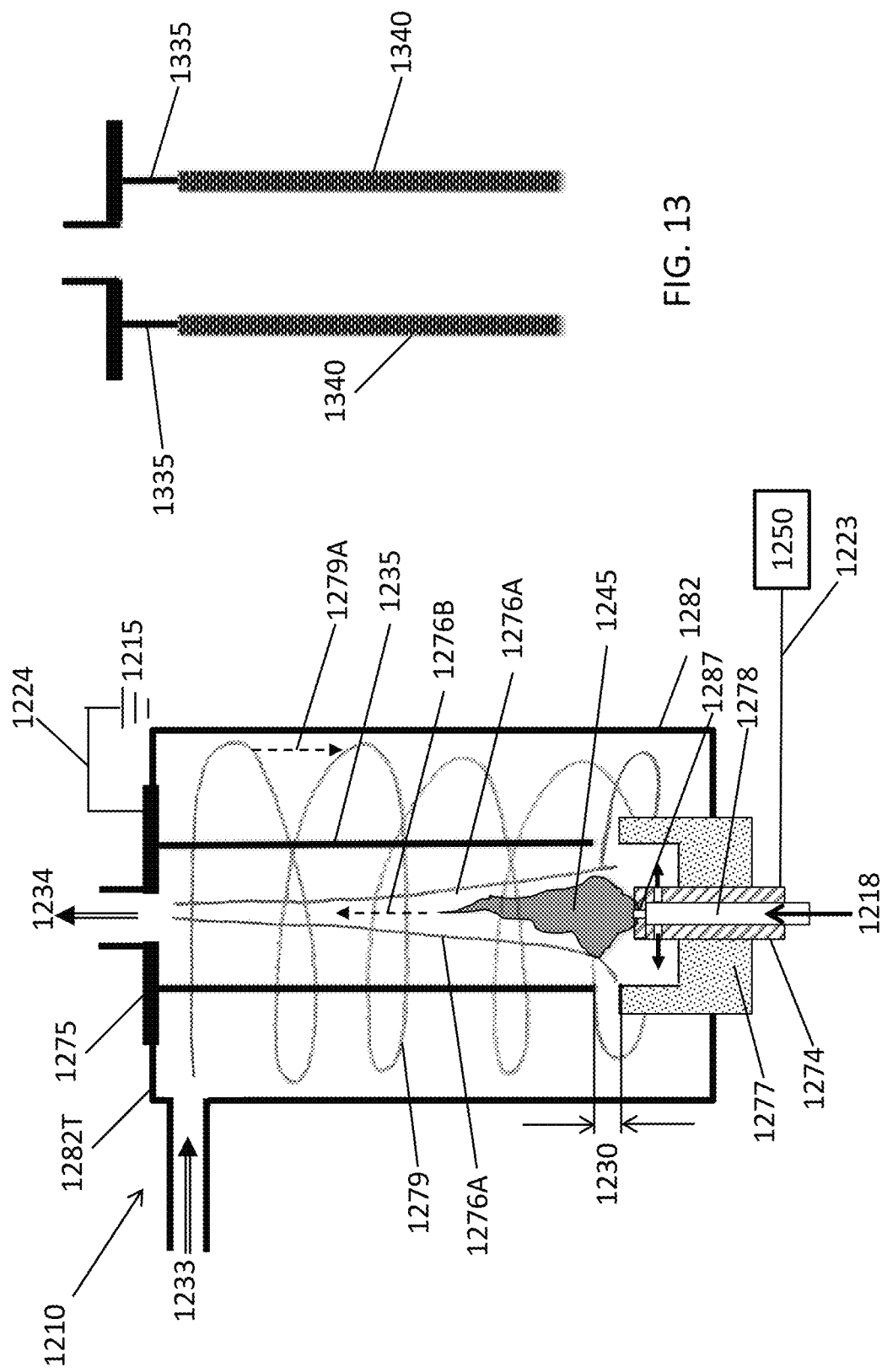

SYSTEM AND METHOD FOR PLASMA DISCHARGE IN LIQUID

CROSS-REFERENCE TO RELATED APPLICATIONS

This application is a continuation-in-part of U.S. application Ser. No. 15/511,425 filed on Mar. 15, 2017, which is a national stage filing of International Application No. PCT/US15/50137 filed on Sep. 15, 2015, which claims priority to U.S. provisional application No. 62/050,369 filed on Sep. 15, 2014, all of which are incorporated herein by reference in their entireties.

BACKGROUND OF THE INVENTION

Oil and gas production processes generate large volumes of liquid waste. For example, hydraulic fracturing of shale utilizes large volumes of high-pressure water to fracture shale formation. The wastewater generated during the drilling phase is called flowback water, whereas the water generated during the production phase is called produced water. Both the flowback and produced waters contain various organic and inorganic components, and discharging produced water can pollute surface and underground water and soil. Since approximately 250 million barrels per day (i.e., ~30 million $m^3$ per day) of produced water are generated globally (see F. I.-R. Ahmadun et al., "Review of technologies for oil and gas produced water treatment," *J. Hazard. Mater.*, vol. 170, pp. 530-551, 2009), an amount that is expected to continue increasing for an extended period of time, there is a growing need for new methods to treat large volumes of produced water robustly and efficiently. With volatility in the prices of oil and gas, there is a pressing parallel need to reduce the costs of production, including produced water treatment costs.

A variety of methods are currently utilized to treat produced water for the purposes of discharge as well as for recycling and reuse in subsequent hydraulic fracturing operations. This diverse set of water treatment techniques include de-oiling (removing dispersed oil and grease), removal of soluble organics, disinfection, suspended solid particle removal, dissolved gas removal (including hydrocarbon gases, carbon dioxide, and hydrogen sulfide), desalination (removing sodium and chloride ions), and water-softening (reducing calcium and magnesium hardness), among others (see F. I.-R. Ahmadun et al.).

Plasma arc discharge generates a significantly elevated temperature beyond 2,000 K around the arc (see A. Czernichowski et al., "Spectral and electrical diagnostics of gliding arc," *Acta Physica Polonica-Series A General Physics*, vol. 89, pp. 595-604, 1996; and O. Mutaf-Yardimci et al., "Thermal and nonthermal regimes of gliding arc discharge in air flow," *Journal of Applied Physics*, vol. 87, pp. 1632-1641, 2000). In addition, plasma discharge generates active plasma species directly in liquid, i.e., OH, O, $O_3$, $H_2O_2$, $NO_x$, UV and electric fields. Thus, if one can successfully generate plasma discharge in produced water, the plasma discharge can be applied for the removal of dispersed oil/grease and soluble hydrocarbons (see N. McIntyre et al., "Uses of ultraviolet/ozone for hydrocarbon removal: Applications to surfaces of complex composition or geometry," *J. Vac. Sci. Technol., A: Vacuum, Surfaces, and Films*, vol. 9, pp. 1355-1359, 1991), water softening (see Y. Yang et al., "Removal of $CaCO_3$ scales on a filter membrane using plasma discharge in water," *Int. J. Heat Mass Transfer*, vol. 52, pp. 4901-4906, 2009; and Y. Yang et al., "Mineral Fouling Control by Underwater Plasma Discharge in a Heat Exchanger," *J. Heat Transfer*, vol. 133, p. 054502, 2011), and disinfection (see H.-S. Kim et al., "Concentration of hydrogen peroxide generated by gliding arc discharge and inactivation of E. coli in water," *Int. Commun. Heat Mass Transfer*, vol. 42, pp. 5-10, 2013). These active plasma treatment species may be employed for produced and flowback water from oil and gas exploration as well as, more broadly, wastewater streams from municipalities and range of industrial processes.

Generation of plasma discharge requires the use of two or more electrodes, for example, at least one cathode and one anode, positioned relatively close together (e.g., 2-5 mm for discharge in gas). When the voltage between the two electrodes increases to a certain value such as 2 kV, breakdown of gas between the two electrodes takes place, generating a discharge of plasma. Depending on the magnitude of the voltage across the two electrodes and other factors such as the geometry of electrodes, a variety of different types of plasma discharges can be produced and controlled, including corona, spark, and arc.

When one attempts to produce plasma discharges in liquid such as water, it is more complicated. As soon as two electrodes with high voltage are immersed in water, electrolysis occurs, generating gas bubbles at both electrodes. When there are sufficient amounts of gas at the two electrodes, the "breakdown" of water can occur, and subsequently plasma discharge takes place in water. The use of gas bubbles generated from electrolysis can result in breakdown in a small volume of water, for example, as in a beaker. However, in order to treat several gallons of water per minute or more, plasma generation using gas bubbles generated from electrolysis is a method that is neither sufficient nor practical.

Another technical challenge in generating plasma discharge in water treatment applications such as produced water or seawater is their high electric conductivity. The conductivity of produced water is in the range of 100-200 mS/cm due to a large amount of dissolved ions such as sodium, calcium, chloride, magnesium, and others (see F. I.-R. Ahmadun et al.), whereas that of seawater is about 50 mS/cm (see V. L. Snoeyink et al., *Water chemistry*. New York: John Wiley, 1980). In liquids with such high conductivity, electrons instantly and continually flow from cathode to anode as high electric conductivity water provides an effective path for electrons to flow, a phenomenon that can be referred as electron leakage in liquid. Accordingly, compressed gas is injected at or between the two electrodes to provide a gap to assist breakdown such that plasma is able to be discharged in high conductivity liquid using only a moderately high voltage of ~1 kV. When gas injection is utilized to assist the generation of plasma discharges in high electric-conductivity liquids, it is essential to have gas bubbles remain in the gap between the two electrodes such that the breakdown of water takes place, leading to the generation of plasma discharge.

At the moment when gas bubbles occupy the space between the two electrodes by displacing liquid, breakdown occurs, generating plasma discharge. However, since gas density is approximately 1,000 times smaller than that of liquid (i.e., water) (see B. Munson et al., *Fundamentals of Fluid Mechanics*, 7th ed. New York: John Wiley & Sons, Inc., 2013), gas bubbles tend to rise in a liquid-filled plasma reactor due to the buoyancy force created by the density difference between gas and liquid. FIGS. 1A and 1B show an example of gas injection between two electrodes according to a prior art system 100, 102. Two electrodes 11 and 12 are used for the generation of plasma discharge 41 in plasma reactor 61: one is the ground electrode 12, and another is high-voltage (HV) electrode 11. Compressed gas 18 is injected from the bottom of the reactor 61 through a gas inlet 19, producing a number of gas bubbles 17 in liquid medium 10. When the gas bubbles 17 occupy the space 42 between the two electrodes, breakdown occurs, generating plasma discharge 41 in the liquid 10 (see 100, FIG. 1A). When gas bubbles 17 are not present in the space 42 between the two electrodes, breakdown does not occur (see 102, FIG. 1B), and accordingly, there is no plasma discharge. In the arrangement of the two electrodes as shown in FIGS. 1A and 1B, the generation of plasma discharge 41 solely depends on the gas dynamics of the bubbles 17. Since the motion of a number of small gas bubbles is not easily controllable, the generation of plasma discharge 41 in liquid 10 becomes unstable and unreliable. In addition, when plasma discharge is applied to treat a large volume of water, for example, at a flow rate of 10 or 100 gpm, it is technically challenging because plasma discharges often occur only between the two electrodes placed relatively close together (e.g., a 5 mm space) and not in the bulk volume of water.

Therefore, there is a need in the art to have a large size plasma discharge in a plasma reactor such that there is a relatively large volume of exposure and sufficient contact time between the plasma discharge and water being treated. Further, there is a need to contain, restrict or control the gas bubbles within a small space between the two electrodes. Methods to restrict the motion of the gas injected to plasma reactor are necessary so that gas bubbles stay longer in the plasma reactor, resulting in the steady and stable generation of plasma discharges in liquid. Still further, there is a need for a method of generating plasma discharge in liquid which does not depend on the electric conductivity of the liquid.

SUMMARY OF THE INVENTION

In one embodiment, a system for generating a plasma discharge in liquid includes a first and second electrode spaced apart in an interior space of a vessel, a channel defined at least partially by at least one of the first and second electrodes, and a first inlet in fluid communication with the interior space configured to generate a vortical fluid flow at a tip of the first electrode. In one embodiment, a second outlet in fluid communication with the interior space configured to facilitate the generation of the vortical fluid flow. In one embodiment, the first inlet and the second outlet are positioned to generate a forward vortex liquid flow. In one embodiment, the first inlet and the second outlet are positioned to generate a reverse vortex liquid flow. In one embodiment, the first inlet and the second outlet are positioned to generate a vortex between the first and second electrode. In one embodiment, the first electrode is a high-voltage electrode and the second electrode is a ground electrode. In one embodiment, the first electrode is a positive high-voltage electrode and the second electrode is a negative high-voltage electrode. In one embodiment, the second electrode is coaxially disposed around the first electrode. In one embodiment, the channel is disposed between the first and second electrode. In one embodiment, both the first and second electrodes have a hollow cylindrical geometry, and the second electrode is coaxially disposed around the first electrode. In one embodiment, an insulation structure is disposed between the first and second electrode along a length of the first electrode.

In one embodiment, a method for generating a plasma discharge in liquid is disclosed. The method includes the steps of positioning a first electrode and a second electrode the liquid, where the first electrode is separated from the second electrode by a distance, generating a voltage between the first and second electrode, injecting a gas through a channel defined at least partially by at least one of the first and second electrodes, and generating a vortex in the liquid at a tip of the first electrode. In one embodiment, an increased electrical impedance is generated between the first and second electrode as the liquid in the space between the two electrodes is replaced by gas. In one embodiment, the first electrode is a high-voltage electrode and the second electrode is a ground electrode. In one embodiment, the second electrode is coaxially disposed around the first electrode. In one embodiment, the method includes the step of injecting a gas through a channel disposed between the first and second electrode. In one embodiment, the both the first and second electrodes have a hollow cylindrical geometry, and the second electrode is coaxially disposed around the first electrode. In one embodiment, the method includes the step of injecting a gas through a channel disposed in the first electrode. In one embodiment, an insulation structure is disposed between the first and second electrode along a length of the first electrode. In one embodiment, the vortex is a forward vortex liquid flow. In one embodiment, the vortex is a reverse vortex liquid flow. In one embodiment, the vortex is generated between the first and second electrode. In one embodiment, an increased electrical impedance is generated between the first and second electrode as the liquid in the space between the two electrodes is replaced by gas.

In one embodiment, an electrode assembly includes a high voltage electrode having a proximal end inlet, a distal end outlet and a lumen therebetween, a ground electrode having a proximal and distal end, where the distal end of the ground electrode at least partially surrounds and extends beyond the distal end outlet of the high voltage electrode, and a spacer region between the high voltage electrode and the ground electrode. In one embodiment, the spacer region includes an air gap. In one embodiment, the spacer region includes an insulation structure. In one embodiment, the high voltage electrode is a positive high voltage electrode and the ground electrode is a negative high voltage electrode. In one embodiment, both the high voltage and ground electrode have substantially planar geometries. In one embodiment, the ground electrode is coaxially disposed around the high voltage electrode. In one embodiment, a channel is disposed in the spacer region. In one embodiment, both the high voltage electrode and the ground electrode have a hollow cylindrical geometry. In one embodiment, the high voltage electrode has a hollow cylindrical geometry and the ground electrode has a substantially planar geometry.

In one embodiment, a system for generating a plasma discharge in liquid includes a high voltage electrode having a proximal end inlet, a distal end outlet and a lumen therebetween, a ground electrode, and a vessel for holding a liquid therein, the vessel having at least one liquid inlet and at least one liquid outlet, where the high voltage electrode is positioned within the vessel such that the distal end outlet is submergible in a liquid contained within the vessel. In one embodiment, the at least one liquid inlet and at least one liquid outlet are configured to facilitate the generation of a vortical fluid flow of the liquid. In one embodiment, the at least one liquid inlet and at least one liquid outlet are positioned to generate a reverse vortex liquid flow. In one embodiment, the at least one liquid inlet and at least one liquid outlet are positioned to generate a vortex liquid flow between the high voltage electrode and the ground electrode. In one embodiment, the system includes a spacer region between the high voltage electrode and the ground electrode. In one embodiment, the spacer region includes an air gap. In one embodiment, the spacer region includes an insulation structure. In one embodiment, the high voltage electrode is a positive high voltage electrode and the ground electrode is a negative high voltage electrode. In one embodiment, the ground electrode is coaxially disposed around the high voltage electrode. In one embodiment, a channel is disposed in the spacer region. In one embodiment, both the high voltage electrode and the ground electrode have a hollow cylindrical geometry.

In one embodiment, a method for generating a plasma discharge in liquid is disclosed. The method includes the steps of positioning at least a distal portion of a high voltage electrode in a liquid, the high voltage electrode having a proximal end inlet, a distal end outlet and a lumen therebetween, positioning at least a portion of a ground electrode in the liquid, injecting a gas through the lumen of the high voltage electrode and into the liquid via the distal end outlet, forming a vortex flow pattern between the electrodes within the liquid and generating an electrical voltage between the electrodes to form a plasma within the liquid. In one embodiment, the flow pattern is a forward vortex liquid flow. In one embodiment, the flow pattern is a reverse vortex liquid flow. In one embodiment, the high voltage electrode is a positive high voltage electrode and the ground electrode is a negative high voltage electrode. In one embodiment, the high voltage electrode is surrounded by an insulator structure. In one embodiment, the high voltage electrode has a hollow cylindrical geometry.

In one embodiment, a system for generating a plasma discharge in liquid includes first and second electrodes spaced apart in an interior space of a vessel, a channel defined at least partially by at least one of the first and second electrodes for injecting a gas in a first direction, and a first inlet in fluid communication with the interior space configured to generate a vortical fluid flow in a second direction in the interior space. In one embodiment, a portion of the channel is directed through a sidewall of the first electrode. In one embodiment, the portion of the channel is substantially tangential to a longitudinal axis of the first electrode. In one embodiment, the first and second direction are the same direction. In one embodiment, the first and second direction are opposite directions.

In one embodiment, a method for generating a plasma discharge in liquid includes the steps of positioning at least a distal portion of a high voltage electrode in a liquid, the high voltage electrode having a proximal end inlet, a distal end outlet and a lumen therebetween, positioning at least a portion of a ground electrode in the liquid, injecting a gas through the lumen of the high voltage electrode and into the liquid at a first direction via the distal end outlet, forming a vortex flow pattern in a second direction between the electrodes within the liquid, and generating an electrical voltage between the electrodes to form a plasma within the liquid. In one embodiment, the gas exits the high voltage electrode through a sidewall of the high voltage electrode. In one embodiment, the gas exits the high voltage electrode tangentially to a longitudinal axis of the high voltage electrode. In one embodiment, the first and second direction are the same direction. In one embodiment, the first and second direction are opposite directions.

In accordance with one or more embodiments, a system for generating a plasma discharge in liquid includes a liquid inlet and a liquid outlet in fluid communication with an interior space of a liquid vessel, the inlet and outlet both disposed near a top side of the liquid vessel and configured to generate a vortex fluid flow in the interior space of the liquid vessel, and a high voltage electrode and a ground electrode spaced apart, the high voltage electrode i) disposed at a bottom side of the liquid vessel, and ii) including a gas channel for gas injection into the liquid vessel. In some embodiments, the system can further include a liquid reservoir in fluid communication with the interior space of the liquid vessel and a pump that pumps liquid between the liquid reservoir and the liquid vessel. In these embodiments, the system can further include a liquid spray nozzle in the liquid reservoir, the liquid spray nozzle in fluid communication with the liquid outlet. In certain embodiments, the liquid inlet can be disposed tangentially relative to a sidewall of the liquid vessel to generate the vortex fluid flow in the interior space. In some embodiments, the liquid outlet can be disposed at a center of the top side of the liquid vessel to generate a reverse vortex fluid flow in the interior space. In certain embodiments, the system can further include an insulator around the high voltage electrode, and a center tube extension of the liquid outlet into the interior space of the liquid vessel, with a gap between the center tube and the insulator. In some embodiments, the insulator can be one of Teflon, glass-filled Teflon, sapphire, or ceramic. In certain embodiments, the system can further include a photocatalyst coating on the center tube. In some embodiments, the photocatalyst can be titanium dioxide ($TiO_2$). In certain embodiments, the ground electrode can be disposed in the interior space of the liquid vessel. In some of these embodiments, the ground electrode can be disposed coaxially around the high voltage electrode. In certain embodiments, the system can further include an insulator between the high voltage electrode and the ground electrode, along a length of the high voltage electrode. In some embodiments, the insulator can be one of Teflon, glass-filled Teflon, sapphire, or ceramic. In certain embodiments, the ground electrode can be disposed at the top side of the liquid vessel. In certain other embodiments, the ground electrode can be disposed upstream of the liquid inlet in fluid communication with the liquid. In some embodiments, the high voltage electrode can further include an endcap and a plurality of lateral openings in a sidewall of the high voltage electrode proximal to the endcap. In certain embodiments, the endcap can include a central opening. In some embodiments, the lateral openings can be disposed radially in the sidewall of the high voltage electrode. In some other embodiments, the lateral openings can be disposed tangentially in the sidewall of the high voltage electrode.

In accordance with one or more embodiments, a method of generating a plasma discharge in liquid includes providing a high voltage electrode and a ground electrode spaced apart, disposing the high voltage electrode at a bottom side of a liquid vessel, the high voltage electrode including a gas channel, generating a vortex fluid flow inside the liquid vessel, injecting gas through the gas channel into the liquid vessel, and applying an electrical voltage between the high voltage electrode and the ground electrode to generate a plasma discharge in the liquid vessel. In some embodiments, generating the vortex fluid flow inside the liquid vessel can include pumping liquid from a liquid reservoir through a liquid inlet into the liquid vessel and out through a liquid outlet out of the liquid vessel. In certain embodiments, the method can further include generating the vortex fluid flow around the high voltage electrode.

In accordance with one or more embodiments, a system for generating a plasma discharge in liquid includes a liquid inlet and a liquid outlet in fluid communication with an interior space of a liquid vessel, the inlet and outlet both disposed near a top side of the liquid vessel and configured to generate a vortex fluid flow in the interior space of the liquid vessel, and a high voltage electrode and a ground electrode spaced apart, the high voltage electrode i) disposed at a bottom side of the liquid vessel, ii) including a gas channel for gas injection into the liquid vessel, and iii) an endcap and a plurality of lateral openings in a sidewall of the high voltage electrode proximal to the endcap, and the ground electrode disposed upstream of the liquid inlet in fluid communication with the liquid. In some embodiments, the endcap can include a central opening. In certain embodiments, the lateral openings can be disposed radially in the sidewall of the high voltage electrode. In certain other embodiments, the lateral openings can be disposed tangentially in the sidewall of the high voltage electrode. In some embodiments, the system can further include an insulator around the high voltage electrode, and a center tube extension of the liquid outlet into the interior space of the liquid vessel, with a gap between the center tube and the insulator. In certain embodiments, the insulator can be one of Teflon, glass-filled Teflon, sapphire, or ceramic. In some embodiments, the system can further include a photocatalyst coating on the center tube. In certain embodiments, the photocatalyst can be titanium dioxide ($TiO_2$).

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which:

FIG. 2A is a schematic diagram of a vertically positioned co-axial cylindrical electrode in a plasma reactor according to one embodiment, where gas bubbles are introduced from the top. FIG. 2B is a top view and FIG. 2C is a perspective view of the cylindrical electrode.

FIGS. 3A and 3B are side view and top view, respectively, showing schematic diagrams of a forward vortex flow of liquid to be treated in plasma reactor according to one embodiment. The liquid to be treated enters the plasma reactor from one end of the reactor tangentially through an inlet, making clockwise spiral vortex flow and leaving the reactor also tangentially through an exit at the other end of the reactor.

FIGS. 11A and 11B are side and top views, respectively, showing schematic diagrams of a system for generating a plasma discharge in liquid in accordance with one or more embodiments.

FIGS. 12A and 12B are side and top views, respectively, showing schematic diagrams of another system for generating a plasma discharge in liquid in accordance with one or more embodiments.

FIG. 12C is a side view showing a schematic diagram of a system for generating a plasma discharge in liquid including a center tube extension of the liquid outlet in accordance with one or more embodiments.

FIG. 13 is a side view showing a schematic diagram of a center tube extension of the liquid outlet including a photocatalyst coating in accordance with one or more embodiments.

DETAILED DESCRIPTION OF THE INVENTION

Figure 1A:
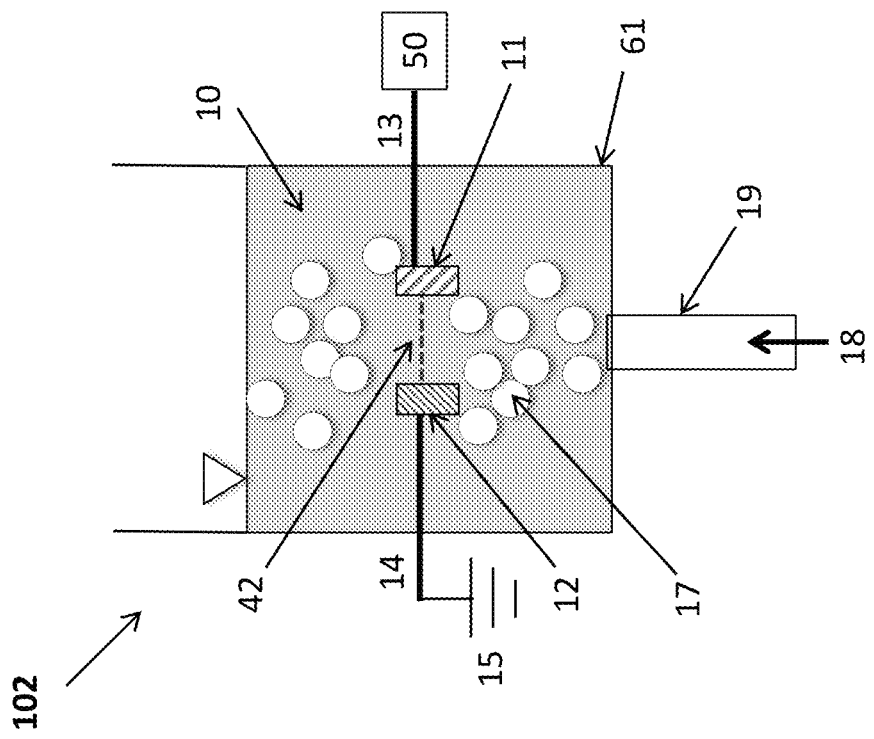
FIGS. 1A and 1B are schematic diagrams of a prior art system for plasma arc discharge between two electrodes, where gas bubbles are introduced from the bottom.
Figure 1B:
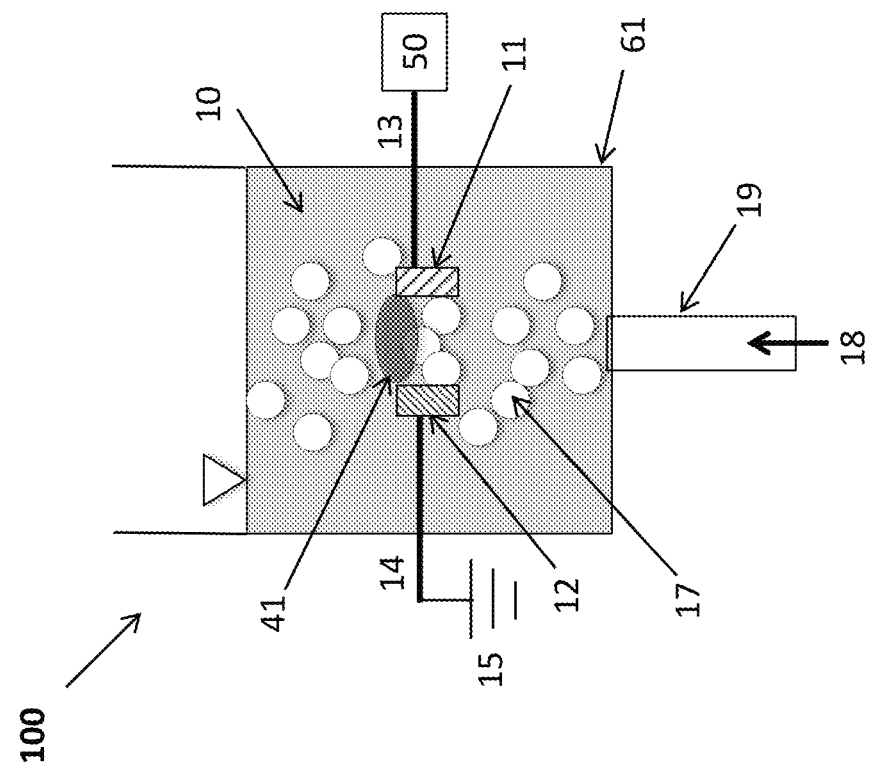

It is to be understood that the figures and descriptions of the present invention have been simplified to illustrate elements that are relevant for a more clear comprehension of the present invention, while eliminating, for the purpose of clarity, many other elements found in systems and methods of plasma discharge in liquid. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

"HV" as used herein means high-voltage.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

In certain embodiments, vortex flows of liquid can be clockwise or counterclockwise, and they can move from the bottom-up or top-down in a given reactor. Types of vortex flows are also varied and can include spiral flows, tornado flows, forward vortex flows, reverse vortex flows and vortical flows among others. Plasma water treatment reactors likewise may in certain embodiments be oriented vertical, horizontally, or diagonally. In certain embodiments, multiple cathodes, anodes, and electrode sets may be used, and the electrodes may vary in shape, size, material and construction. In certain embodiments, a coaxial electrode set includes an outer ground electrode jacket and inner high-voltage electrode stem, both constructed of stainless steel, and could easily take a different shape and be made of a wide variety of different materials such as tungsten, titanium alloy or electrically conductive ceramic.

Referring now in detail to the drawings, in which like reference numerals indicate like parts or elements throughout the several views, in various embodiments, presented herein is a system and method for plasma discharge in liquid.

Embodiments described herein introduce methods of gas injection at or between two or more electrodes (i.e., at least one ground electrode and one high-voltage electrode) in liquid such that gas bubbles can be contained within the space between two electrodes. The purpose of this method is to provide a non-liquid, gas gap between two electrodes which permits breakdown at high voltage in a reactor filled with liquid. As a result, plasma such as an arc is able to be discharged with the help of gas bubbles in a liquid volume, even high-conductivity liquid. In certain embodiments, an increased electrical impedance is generated between a first and second electrode as the liquid in the space between the two electrodes is replaced by gas. Either gas or gas-liquid mixtures can be injected. Wide varieties of chemicals or chemical combinations can be selected for injection as gas such as oxygen, nitrogen, hydrogen, or inert gases among others, and as liquid as in the case of water to generate hydrogen peroxide or ferrous sulfate solution to induce Fenton's oxidation.

Certain embodiments utilize a co-axial electrode geometry, which consists of two co-axial cylindrical geometries. In certain embodiments, the outer cylindrical tube forms the ground electrode, whereas the inner cylindrical tube forms the high-voltage (HV) electrode. The inner high voltage electrode can have DC high voltage (i.e., positive or negative) or AC high voltage. In certain embodiments of utilizing AC high voltage, the polarity in the high voltage electrode continuously switches between negative and positive. In the co-axial geometry, gas can be introduced through the inner tube space in the HV electrode or alternatively through the space between the two cylindrical electrodes. Since both electrodes are immersed in liquid, an annulus tube made of insulation material (e.g., glass-filled Teflon, Macor, or borosilicate) is used between the outer ground electrode and the HV center electrode tube so that discharge does not take place except at the tip of the HV electrode. For this purpose, the electric insulation material surrounds the HV electrode except at the tip. Such an insulation protection prevents the leakage of electrons from the HV electrode to liquid. This is particularly important in a high-conductivity liquid as the insulation layer prevents electrons from leakage at the HV electrode.

In order to have the HV electrode surrounded by gas inside a plasma reactor filled with liquid, certain embodiments utilize either forward vortex liquid flow or reverse vortex liquid flow inside the plasma reactor. In certain embodiments, in the case of forward vortex liquid flow, a co-axial electrode system is used for the generation of plasma discharge in liquid, whereas in the case of the reverse vortex liquid flow, two electrodes are positioned on the opposite sides (i.e., top and bottom) of the plasma reactor.

In one embodiment, with reference now to FIGS. 2A-2C, a co-axial cylindrical electrode 200A-C is vertically positioned at the top of vessel 62 for holding a liquid. The outer cylindrical tube 22 forms the ground electrode 22, whereas the inner cylindrical tube 21 forms the HV electrode 21. An annulus tube made of an electrical insulation material 26 such as glass-filled Teflon is used between the outer ground electrode 22 and the HV center electrode tube 21. The HV electrode 21 is connected to HV power supply 50 via a connecting wire 23, whereas the ground electrode 22 is connected to a ground source 15 via a connecting wire 24. Compressed gas 18 is introduced through the channel 28 inside the HV electrode 21. At the end of the HV electrode, a gas spray nozzle 27 is installed to generate a vortex spray flow 29, which rotates, for example, clockwise.

Referring now to FIGS. 3A and 3B, in one embodiment, incoming liquid 33 enters the plasma reactor 63 from the bottom of the reactor 63 tangentially through an inlet 31, forming clockwise forward vortex flows 39. Exiting liquid 34 leaves the reactor 63 also tangentially through an exit 32 at the top of the reactor 63. Forward vortex flow 39 of liquid creates a low-pressure zone at the center of the reactor 63 as the centrifugal force pushes liquid molecules outward along the radial direction. Accordingly, as shown in the side and top views of the system 300A, B, the compressed air 18 introduced through the channel 28 inside the HV electrode tube 21 occupies the low-pressure zone 36 of an inverted cone shape in the reactor 63, naturally forming a gas pocket at the center of the reactor 63.

Figure 4:
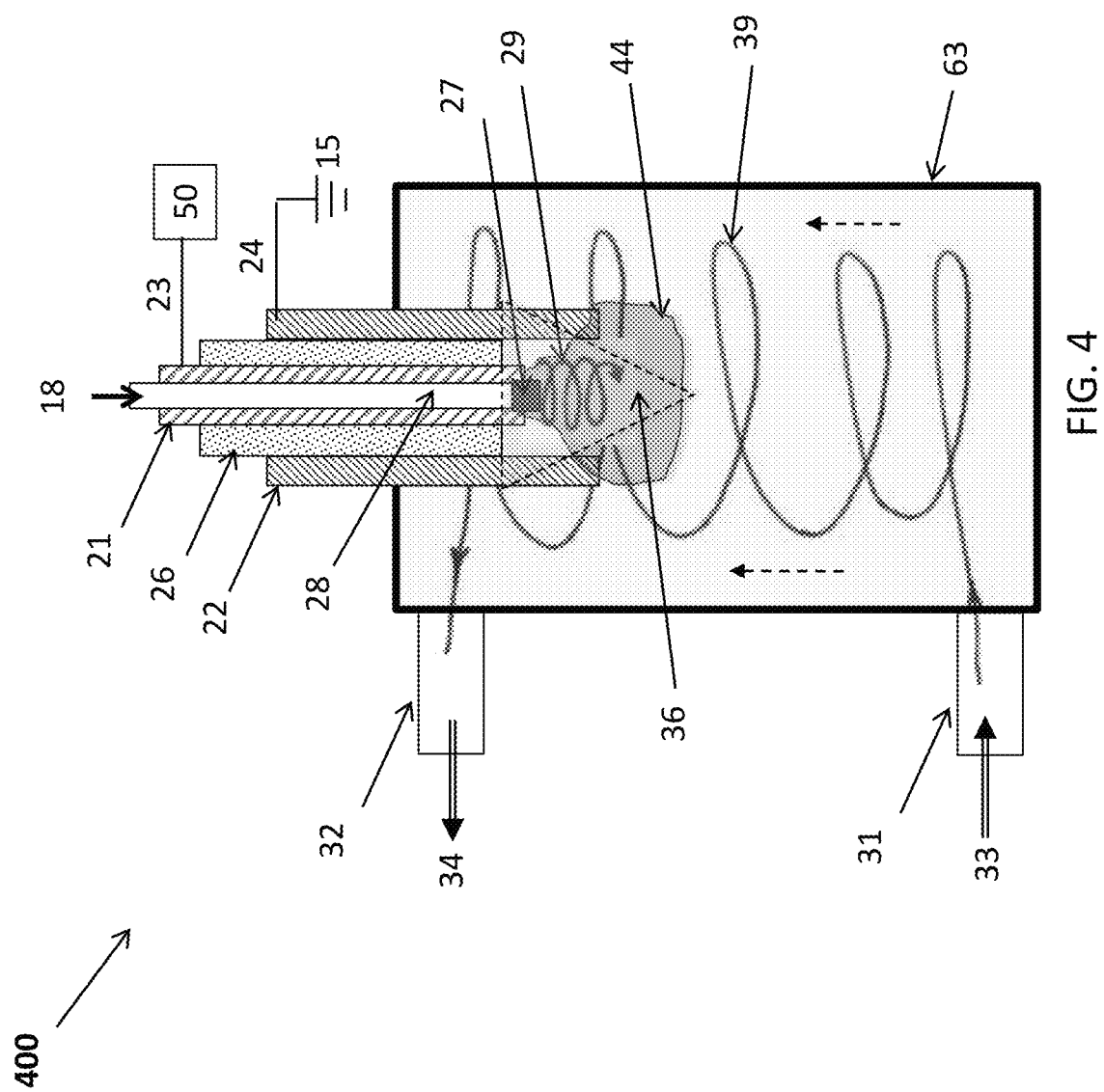
FIG. 4 is a schematic of forward vortex flows of compressed gas and liquid, both rotating in the same (i.e., clockwise) direction according to one embodiment. Due to the centrifugal force created by the spiral vortex flow of liquid, a low-pressure zone is created at the middle of the plasma reactor, which subsequently fills with compressed gas. The middle zone filled with gas inside the reactor provides an ideal medium for the stable generation of plasma arc discharge in plasma reactor.

Referring now to FIG. 4, in one embodiment of a system 400, as the centrifugal force produced by the forward vortex flow of liquid 39 creates a low-pressure zone 36 at the middle of the plasma reactor 63, compressed gas 18 fills the low-pressure zone 36. In one embodiment, the HV electrode 21 and the ground electrode 22 are positioned at the same side (e.g., top) in the middle of the low-pressure zone 36, which is filled with gas surrounded by liquid 10. Thus, the low-pressure zone 36 provides an ideal medium for the generation of plasma arc discharge in the reactor 63 as the HV electrode 21 is surrounded by gas. If the HV electrode 21 makes contact with liquid for even a brief period of time (e.g., >0.5 s), then the short circuit occurs and plasma will extinguish. Thus, it is preferred to have the HV electrode surrounded by gas at all times. In this embodiment, the direction of vortex flow of gas 29 is the same as the direction of the forward vortex flow of liquid 39, i.e., both clockwise directions. In certain embodiments, when the direction of vortex flow of gas 29 is the same as the direction of the forward vortex flow of liquid 39, the counterclockwise direction can also be used.

As plasma arc discharge 44 is produced at the low-pressure zone 36, the compressed gas 18 coming through the channel 28 in the HV electrode 21 pushes the plasma discharge downward, creating arc jet in the middle of rotating liquid 39 along the inner wall of the reactor 63. In other words, the low-pressure zone expands the arc discharge so that the interface surface of the arc 44 is significantly increased, increasing the treatment efficiency of the liquid 10 as the direct contact surface between the arc discharge 44 and liquid increases. In addition, as plasma arc discharge 44 is produced at the low-pressure zone 36, the compressed gas 18 coming through the channel 28 in the HV electrode 21 pushes the plasma discharge downward, creating arc jet in the middle of rotating liquid 39 along the inner wall of the reactor 63. In other words, the low-pressure zone expands the arc discharge so that the interface surface of the arc 44 is significantly increased, increasing the treatment efficiency of the liquid 10 as the direct contact surface between the arc discharge 44 and liquid increases.

Figure 5:
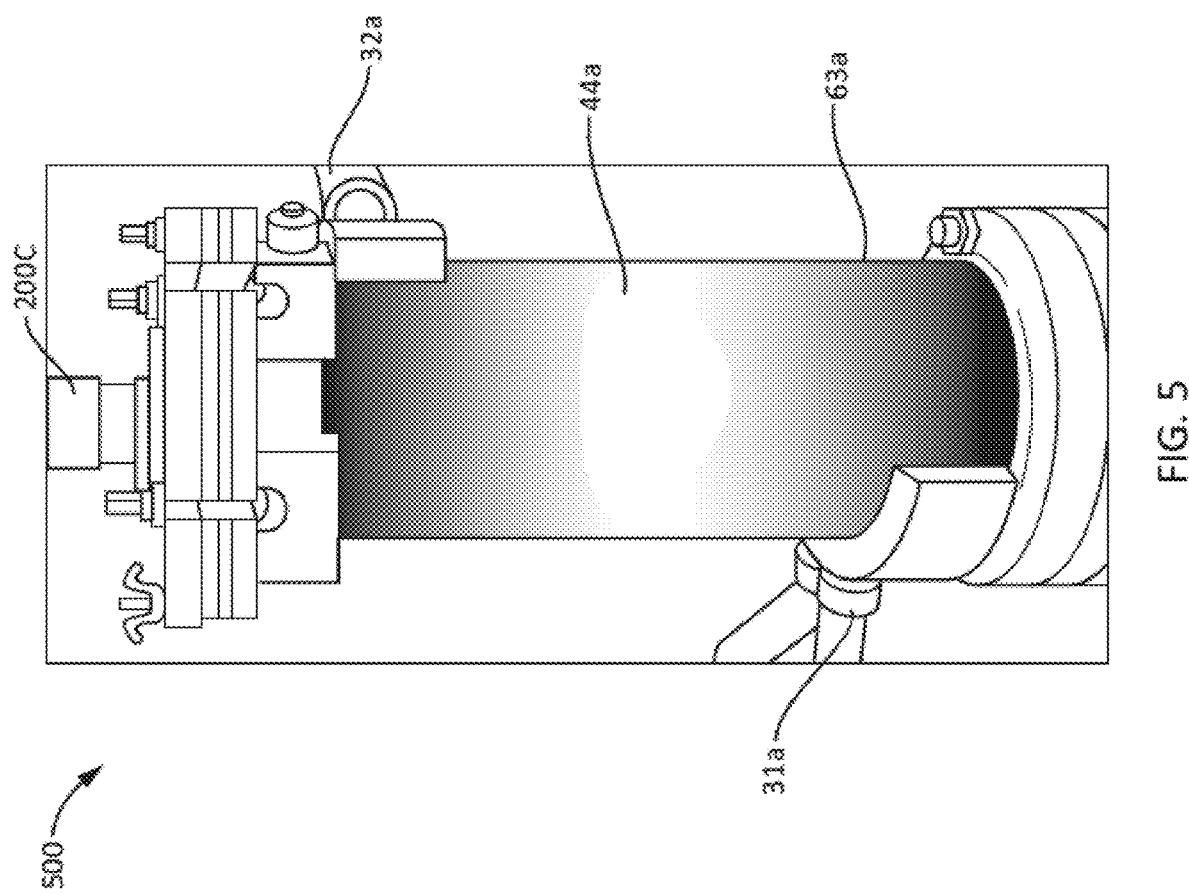
FIG. 5 is a photograph of a plasma arc discharge in produced water in a plasma reactor. The flow rate of produced water was 20 gallons per minute.

With reference now to FIG. 5, a photograph shows an embodiment of a system including the plasma reactor 63a with liquid inlet 31a and outlet 32a, and co-axial electrode 200c installed at the top of the reactor 63a. Also shown is the plasma arc discharge 44a obtained in a test conducted using produced water in the plasma reactor 63a in the present invention. The flow rate of produced water was 20 gallons per minute, which generated a strong spiral vortex flow of produced water. The photograph depicts that the arc discharge 44a had strong UV radiation. In addition, the intensely bright color of the arc discharge supports the notion that the temperature of the arc surface in the produced water could be over 2,000K (see for example A. Czernichowski et al. and O. Mutaf-Yardimci et al.).

Figure 6:
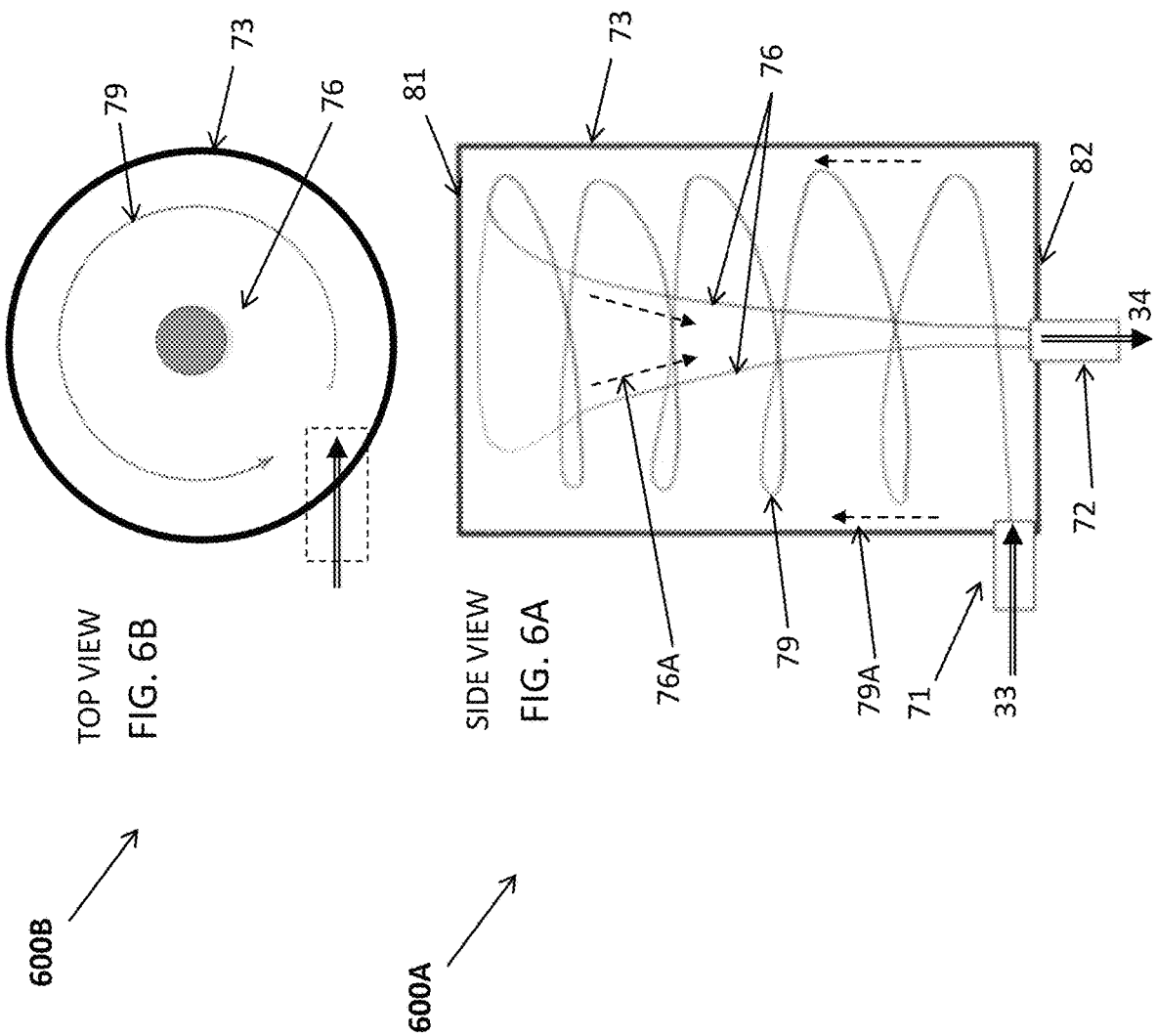
FIGS. 6A and 6B are side and top views, respectively, showing schematic diagrams of a reverse vortex flow of liquid to be treated in plasma reactor. The liquid to be treated enters the plasma reactor from one end of the reactor tangentially through an inlet, making counterclockwise spiral vortex flow and leaving the reactor longitudinally through an exit at the center of the same end of the reactor from which it entered.

In one embodiment of a system 600A, B, with reference now to FIGS. 6A and 6B, incoming liquid 33 enters the plasma reactor 73 tangentially through an inlet 71 located at one end (e.g., near the bottom) of the reactor 73, forming counterclockwise reverse vortex flows 79. The reverse vortex flow 79 moves along the outer edge of the reactor, moving upward as indicated by two dashed arrows 79A in FIG. 6. Reverse vortex flow 79 of liquid creates a low-pressure zone 76 at the center of the reactor 73 as the centrifugal force pushes liquid molecules outward along the radial direction. Accordingly, the compressed air 18 introduced from top through the channel 78 inside the HV electrode tube 74 (see for example FIG. 7), occupies or fills the low-pressure zone 76 in the reactor 73, naturally forming a gas pocket 76 at the center of the reactor 73. Since there is only one exit 72 for both liquid and gas, liquid 34 as well as gas leave through an exit 72 located at the center longitudinally at the same end 82 of the reactor 73 from which liquid entered (e.g., in the bottom). From a two-dimensional perspective, in the reactor 73 with reverse vortex liquid flow 79, liquid moves up along the side wall of the reactor first (i.e., see two upward dashed arrows 79A), and then moves down vertically along the center of the reactor (i.e., see two downward dashed arrows 76A inside the air pocket 76) and leaves the reactor 73 through an exit 72 at the bottom 82 of the reactor 73. The gas enters from the channel 78 inside the HV electrode 74 (see for example FIG. 7) located at the opposite (e.g., top) of the reactor 73 and moves down vertically with liquid and leaves the reactor 73 through the exit 72 longitudinally at the same end 82 as liquid originally entered (e.g., bottom) the reactor 73, as it is the only outlet for both liquid and gas in the case of the reactor 73 with the reverse vortex flow 79.

In one reverse vortex flow system 700, according to an embodiment, as the centrifugal force produced by the reverse vortex flow 79 creates a low-pressure zone 76 at the middle of the plasma reactor 73, compressed gas 18 fills the low-pressure zone 76. The unique feature of the reactor 73 with the reverse vortex flow 79 is that the low-pressure zone 76 extends all the way to the bottom 82 of the reactor 73. On the contrary, in the reactor 63 with forward vortex flow 39, the low-pressure zone 36 is limited to the upper area near the HV electrode 21 in the reactor 63 as both liquid and gas must leave the reactor 63 through an exit 32 located near the top of the reactor 63. Furthermore, as the density of gas is about 1,000 times smaller than liquid, the gas in the low-pressure zone 36 tends to rise, further limiting the low-pressure zone 36 in the forward vortex flow 39.

The reverse vortex reactor 73 has the HV electrode 74 and the ground electrode 75 positioned at the opposite sides, e.g., top 81 and bottom 82 in the reactor 73, respectively. For example, the HV electrode 74 is positioned at the top 81 of the reactor 73, whereas the ground electrode 75 is positioned at the bottom 82 of the reactor 73. The reverse vortex liquid flow 79 creates an extended air channel 76 between the two electrodes 74 and 75 as shown schematically in FIG. 7. Thus, the extended air channel 76 of the low-pressure zone is naturally filled with compressed gas 18 injected through the channel 78 inside the HV electrode 74, providing an ideal path and condition for high-voltage plasma discharge 45 inside the reactor 73 filled by liquid. The gas channel 76 surrounds the HV electrode 74, generating plasma arc discharge 45 in the reactor 73, and thus UV radiation as well as all the reactive species generated from the plasma discharge remain inside the reactor 73. The reactive species include OH, O, $O_3$, $H_2O_2$, $NO_x$, and electric fields. Since most reactive species have short half-life (on the order of milliseconds) except for ozone and hydrogen peroxide, it is beneficial to generate these reactive species near the liquid or inside liquid in the reactor 73 such that the reactive species make direct contact with liquid molecules as the reactive species are generated.

Figure 7:
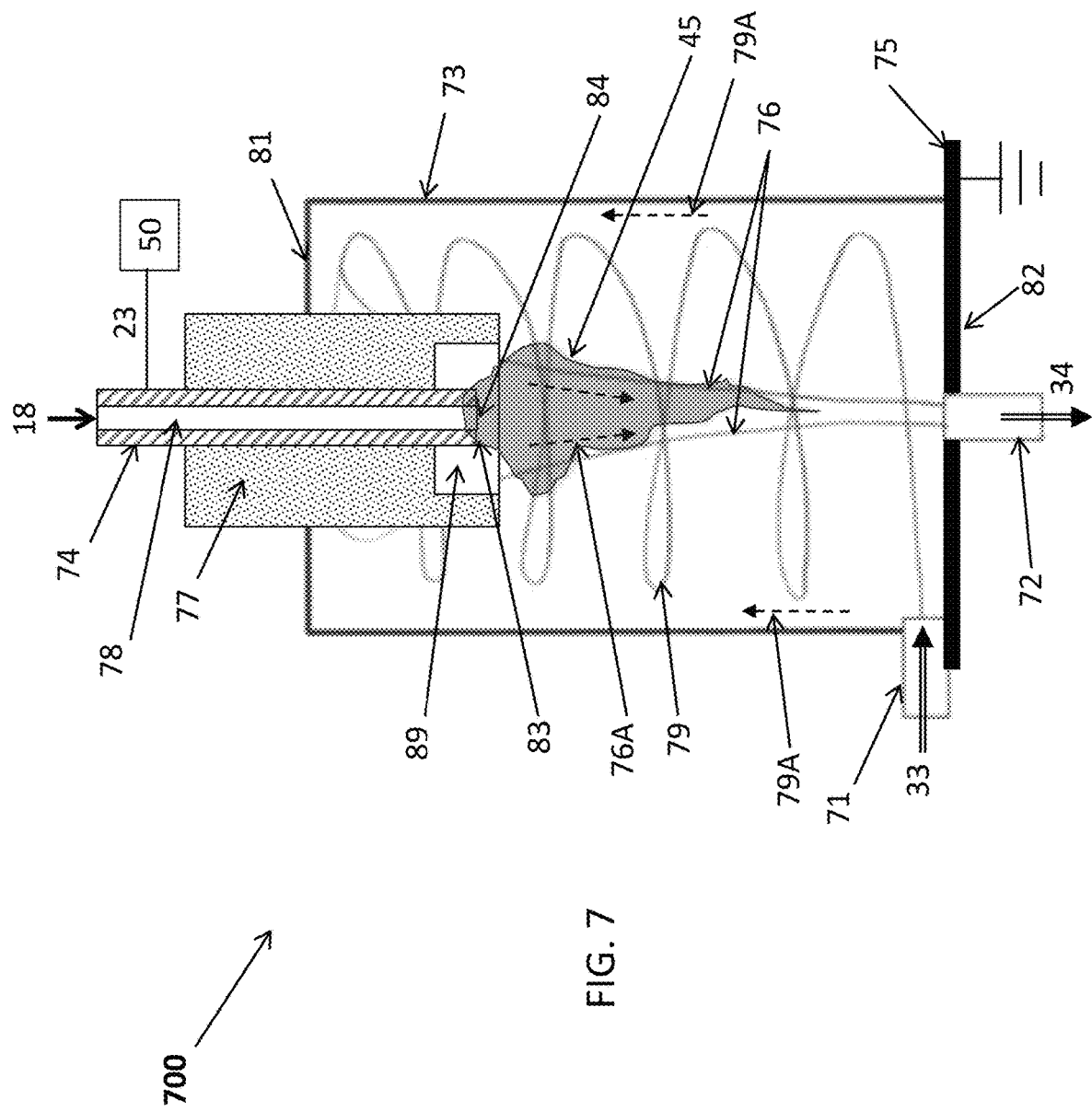
FIG. 7 is a schematic of reverse vortex flows of compressed gas and liquid, both rotating in the same (i.e., counterclockwise) direction according to one embodiment. Due to the centrifugal force created by the reverse vortex flow of liquid, a low-pressure zone is created at the center of the plasma reactor, where the gas is pulled down due to the reverse vortex flow, pulling the plasma discharge downward toward the ground electrode.

One of the major benefits of the reverse vortex flow 79 in the reactor 73 is that the gas moves downward as the exit for both liquid and gas is located at the bottom of the reactor 73. Consequently, the plasma discharge 45 is extended or stretched downward, increasing the size of the plasma discharge much larger than the plasma discharge 44 in the forward vortex flow 39 in the reactor 63. Furthermore, the gas channel 76 surrounds the HV electrode 74, thus preventing liquid from making contact with the HV electrode 74. In certain embodiments, if the HV electrode 74 makes contact with liquid for more than 0.5 s, then the short circuit occurs between the two electrodes 74 and 75, and plasma will extinguish. Thus, it is preferable to have the HV electrode 74 surrounded by gas at all times. The direction of reverse vortex flow of liquid 79 can be in either clockwise or counterclockwise direction. The embodiments of FIGS. 6 and 7 show the reverse vortex flow 79 in the counterclockwise direction. FIG. 7 shows that the compressed gas 18 enters the gas channel 78 and leaves through an exit 84 at the end 83 of the HV electrode tube 74. In this case, the compressed gas 18 naturally moves down (indicated by two dashed arrows 76A inside air pocket 76) following the exiting liquid in the middle of the reactor 73. In one embodiment, both the high voltage and ground electrode have substantially planar geometries. In one embodiment, the high voltage electrode has a hollow cylindrical geometry and the ground electrode has a substantially planar geometry.

Figure 8:
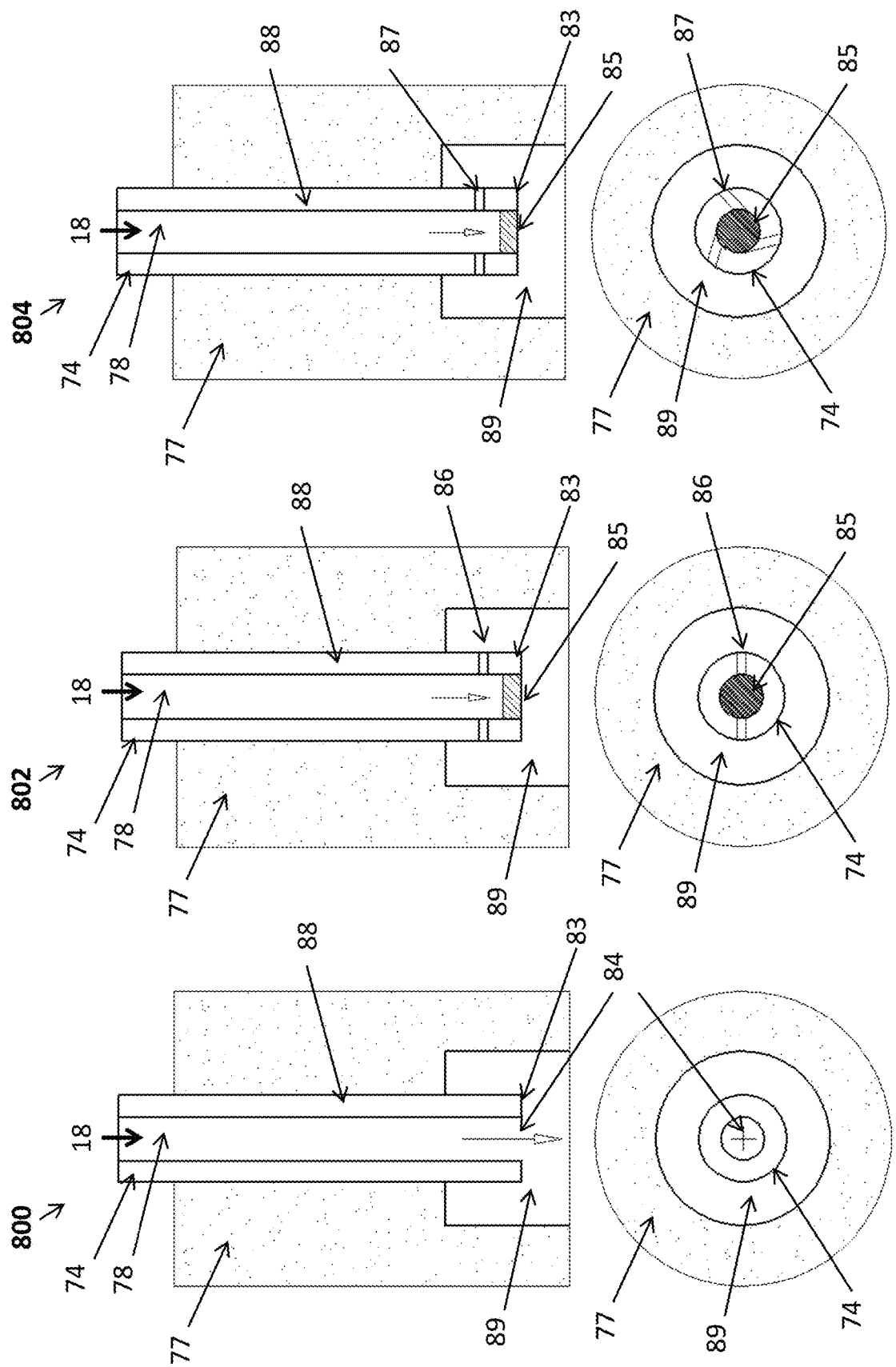
FIGS. 8A-8C are schematics illustrating embodiments of using compressed gas through a channel inside the HV electrode in the plasma reactor together with reverse vortex flows.

Referring now to FIGS. 8A-8C, three different embodiments of using a path of compressed gas 18 through the channel inside the HV electrode 74 are shown. FIG. 8A shows one embodiment of a system 800 similar to that described in FIG. 7, where the compressed gas 18 enters the gas channel 78 and leaves through an exit 84 at the end 83 of the HV electrode tube 74. An insulator block 77 is used to electrically insulate the HV electrode 74 from making contact with liquid, which is electrically conductive. The low end of the insulator block 77 and the HV electrode form a pocket or gap space 89. This pocket or gap space will be filled with compressed gas during operation, as the density of gas is about 1,000 times smaller than that of liquid, providing an ideal place and condition for the generation of plasma discharge.

In another embodiment of a system 802 shown in FIG. 8B, the compressed gas 18 exits the HV electrode 74 through hole(s) 86 made normal to the sidewall 88 of the HV electrode tube 74. In this case, the bottom end 83 of the HV electrode tube 74 is blocked with an end plug 85. Instead, a hole or multiple (two, four, or eight) holes 86 are made on the sidewall 88 so that compressed gas 18 can leave the channel 78 inside the HV tube 74 through the hole(s) 86 made near the bottom end of the sidewall 88. One advantage of this arrangement is that compressed gas first fills the gap space 89 between the HV electrode 74 and insulator 77, so that the HV electrode 74 is always surrounded by gas medium 18, making the plasma discharge 45 much more stable over time. For example, sporadic extinction and re-ignition of plasma discharge 44 occurring in the reactor 63 using the forward vortex 39 does not take place in the reactor 73 using the reverse vortex flow 79, as compressed gas 18 in the gap space 89 is always filled with gas, thus preventing liquid from making contact with the HV electrode 74 in the reactor 73 with the reverse vortex flow 79 during operation.

In another embodiment of a system 804 shown in FIG. 8C, the compressed gas 18 exits the HV electrode 74 through multiple tangential hole(s) 87 made on the near the bottom end 83 of the sidewall 88 of the HV electrode tube 74. In this case, the bottom end 83 of the HV electrode tube 74 is blocked with an end plug 85. Note that the compressed gas 18 can leave the HV electrode 74 tangentially, creating a vortex spiral flow inside the gap space 89 between the HV electrode and insulator 77. An advantage of this arrangement is that compressed gas first fills the gap space 89 between the HV electrode 74 and insulator 77, so that the HV electrode 74 is always surrounded by gas medium 18. In addition, compressed gas rotates in the same direction as the liquid, making the plasma discharge much more stable over time. Alternatively, the geometry of the tangential holes 87 could be configured so that compressed gas rotates in the opposite direction as the liquid, increasing turbulence and mixing of the plasma-induced reactive species with liquid in the reactor.

Figure 9:
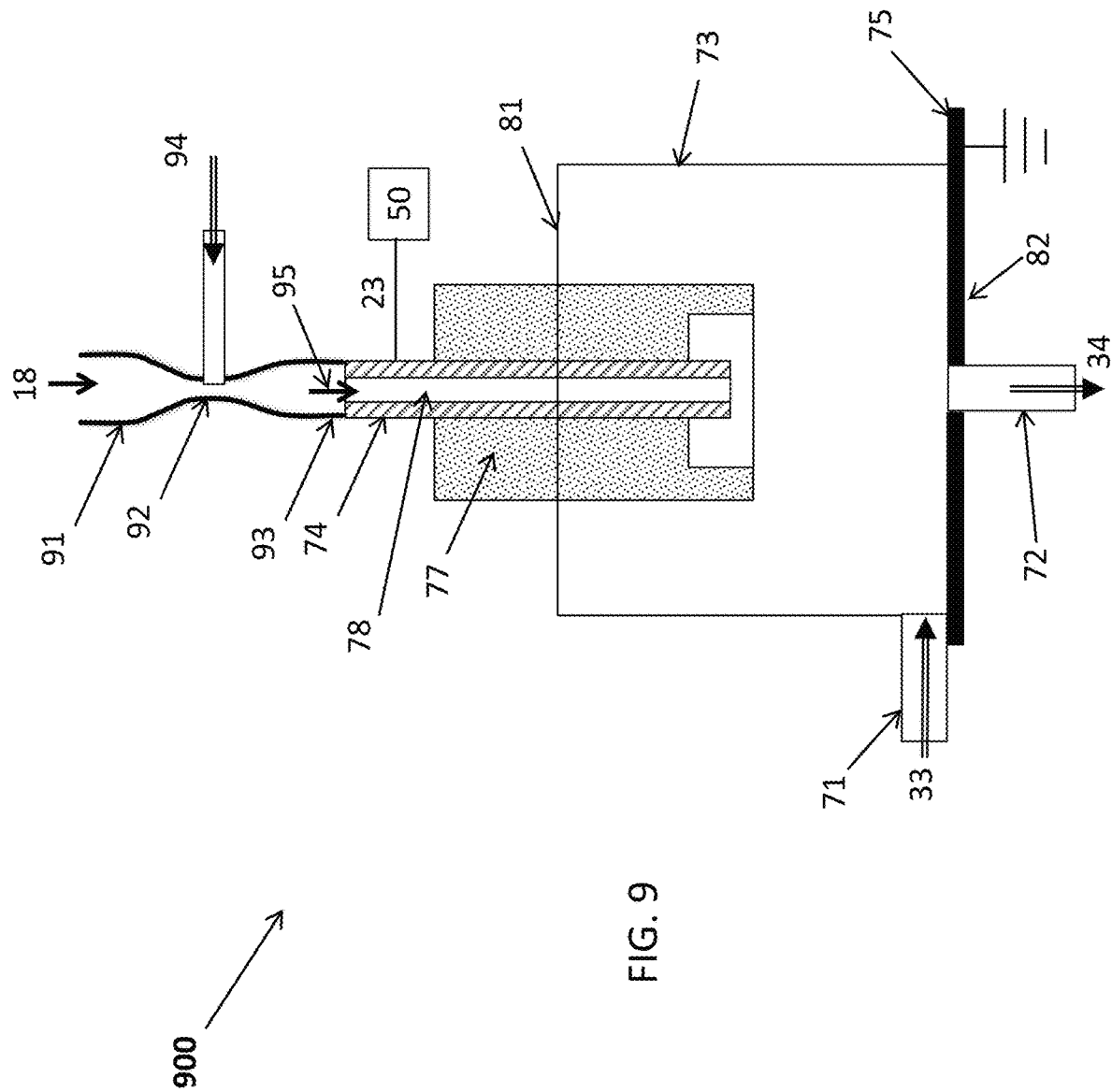
FIG. 9 is a schematic illustrating an embodiment of the system that injects water to the stream of compressed gas supplied to plasma reactor.

With reference now to FIG. 9, a system 900 utilizing a water injection method is shown according to one embodiment, where a device, such as a venturi tube, aspirator or atomizer, is utilized to inject liquid 94 into the stream of compressed gas 18. Depending on the specific water treatment application, it may be desirable to introduce sprays (i.e., small droplets of less than 100 microns in size) comprised of distilled water, tap water, or sea water into the plasma reactor to generate hydrogen peroxide ($H_2O_2$), which is an effective powerful biocide and oxidizer among the reactive species produced by plasma discharge. In addition, any other solution may be injected at this location in order to create a specifically desired chemical treatment process, such as ferrous sulfate solution to induce Fenton's oxidation. Compressed gas 18 flows through the device 91 (e.g., a venturi), and negative vacuum pressure is created at the throat 92 of the venturi according to Bernoulli's Law. A liquid line is connected to the venturi throat 92, where the vacuum sucks liquid 94 into the stream of gas 18, thus mixing 95 the liquid and fast-moving gas together. Accordingly, small droplets of liquid particles are generated and collide with the plasma discharge 45, thus producing hydrogen peroxide ($H_2O_2$) in the case of water injection. Alternatively, a separate pump can be utilized to inject liquid to fast moving air streams without the use of venturi, or an aspirator or atomizer device may be used.

Figure 10:
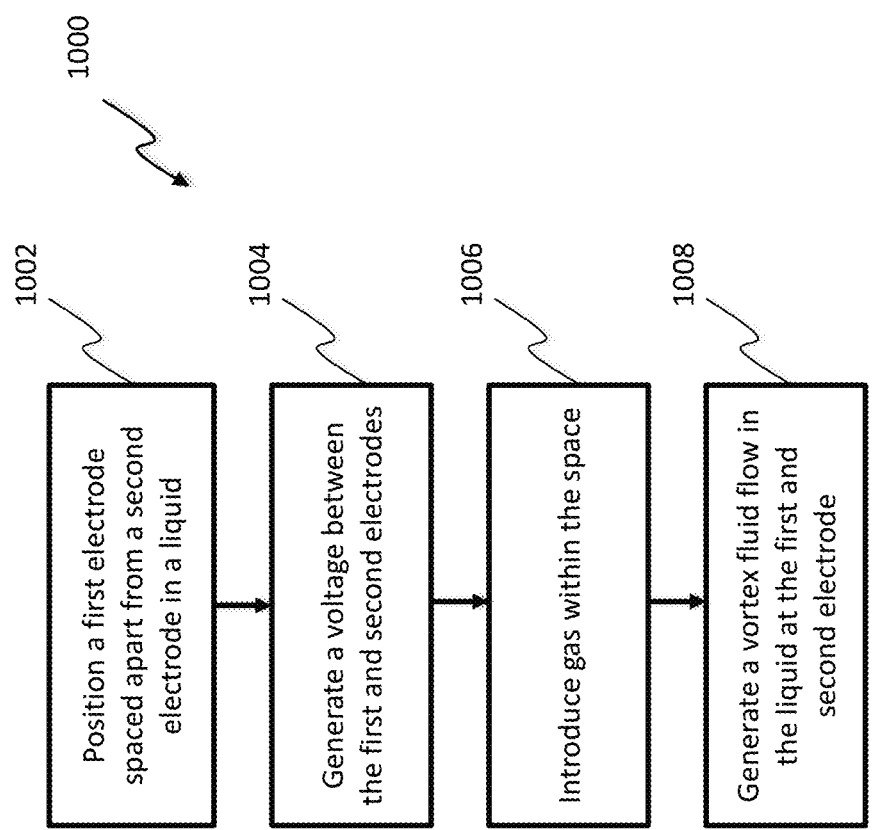
FIG. 10 is a flow chart of a method according to one embodiment.

A method 1000 according to one embodiment is shown in the flow chart of FIG. 10. In one embodiment, a first electrode and a second electrode are positioned in an interior space of the liquid 1002. The first electrode is positioned separated from the second electrode and an electrical voltage is applied between the first and second electrode 1004. The physical geometry and location of the first and second electrode can for example follow the embodiments disclosed herein. Gas is injected through a channel 1006 defined at least partially by at least one of the first and second electrodes, and a vortex flow is generated 1008 in the liquid at a tip of the first electrode. Generation of vortical flow can for example be according to the various embodiments described herein. In one embodiment, the first electrode is a high-voltage electrode and the second electrode is a ground electrode. In one embodiment, the second electrode is coaxially disposed around the first electrode. The method can also include the step of injecting a gas through a channel disposed between the first and second electrode. In one embodiment, both the first and second electrodes have a hollow cylindrical geometry, and the second electrode is coaxially disposed around the first electrode. The method can also include the step of injecting a gas through a channel disposed in the first electrode. In one embodiment, an insulation structure is disposed between the first and second electrode along a length of the first electrode. In one embodiment, the vortex is a forward vortex liquid flow. In one embodiment, the vortex is a reverse vortex liquid flow. In one embodiment, the vortex is generated between the first and second electrode. In one embodiment, an increased electrical impedance is generated between the first and second electrode as the liquid in the space between the two electrodes is replaced by gas.

In accordance with one or more embodiments, in one reverse vortex flow system 1100 for generating a plasma discharge in liquid, shown in FIGS. 11A and 11B, the interior space of the liquid vessel 1182 has the HV electrode 1174 and the ground electrode 1122 forming a co-axial geometry, such that the HV electrode 1174 and the ground electrode 1122 are spaced apart and disposed at the bottom side 1182B of the liquid vessel 1182. The HV electrode 1174 is connected to the HV power supply 1150 via the electrical connecting line 1123, whereas the ground electrode 1122 is connected to a ground source 1115 via the electrical connecting line 1124. Insulating material 1177 (e.g., Teflon, glass-filled Teflon, sapphire, or ceramic) is used along the length of the HV electrode 1174 between the two metal electrodes 1174 and 1122 to separate them electrically. Accordingly, the insulator 1177 also has a co-axial geometry. The HV electrode 1174 is a hollow metal tube, such that compressed gas 1118 can pass through the gas channel 1178. Optionally, as shown in FIG. 11A, the top of the HV electrode 1174 is blocked by an endcap 1127, while the sidewall of the HV electrode 1174 proximal to the endcap 1127 has small lateral openings 1186 (e.g., 4, 6, 8, 10, 12, 14, or 16 lateral openings) for discharging compressed gas 1118, such as compressed air. The number of lateral openings 1186 depends on the diameter of the lateral openings 1186. In other words, as the diameter of the lateral openings 1186 increases, the number of lateral openings 1186 should decrease such that the pressure-drop of gas flow across the sidewall of the HV electrode 1174 remains approximately constant. From the fluid dynamics point of view, it is desirable to have a large number of small lateral openings 1186 on the sidewall of the HV electrode 1174 to have relatively uniform distribution of gas flow in the space between the two electrodes. In one embodiment, the number and diameter of the lateral openings 1186 in a HV electrode 1174 with an outside diameter of 0.75" are 16 and 3 mm, respectively, for a liquid vessel 1182 optimized for a liquid flowrate of 30 gpm. As also shown in FIG. 11A, the gas channel 1178 optionally includes a central opening 1187 in the endcap 1127, with a diameter suitable for discharging compressed gas, such as 3 mm for a liquid vessel 1182 optimized for a liquid flowrate of 30 gpm. When the diameter of the central opening 1187 is greater than 5 mm, plasma cannot be ignited because too much gas flow moves through the central opening 1187 in the endcap 1127 and not enough gas flow moves through lateral openings 1186 on the sidewall of the HV electrode 1174. For a liquid vessel 1182 optimized for a liquid flowrate of 30 gpm, the desirable range of the diameter of the central opening 1187 is in the range of between 1.5 mm and 4 mm.

Since the liquid inlet 1133 and the liquid outlet 1134 are disposed near the top 1182T of the liquid vessel 1182, with the liquid outlet 1134 disposed at the center of the top side 1182T of the liquid vessel 1182 and the liquid inlet 1133 disposed tangentially relative to a sidewall 1182S of the liquid vessel 1182, as shown in FIG. 11B, the liquid forms a reverse vortex flow 1179 inside the liquid vessel 1182. The reverse vortex liquid flow 1179 moves along the outer edge of the liquid vessel 1182, moving downward as indicated by the dashed arrow 1179A, and creating an extended low-pressure zone 1176A at the center of the liquid vessel 1182, as shown schematically in FIG. 11A. As the centrifugal force produced by the reverse vortex flow 1179 creates the low-pressure zone 1176A at the center of the liquid vessel 1182, compressed gas 1118 that is injected into the liquid vessel 1182 from the bottom through the gas channel 1178 fills the low-pressure zone 1176A, creating a gas pocket 1176, shown in FIG. 11B, that rises toward the top of the liquid vessel 1182 (indicated by the dashed arrow 1176B shown in FIG. 11A). An important feature of the liquid vessel 1182 with the reverse vortex flow 1179 is that the low-pressure zone 1176A extends all the way to the top of the liquid vessel 1182. A major advantage of the reverse vortex flow 1179 over forward vortex flow is an increased residence time, as the time that liquid stays inside the liquid vessel is almost doubled. Another advantage of the reverse vortex flow 1179 is that the plasma 1145 is stretched vertically upward as the center of the liquid vessel 1182 is occupied by gas and the intense heat generated by the plasma 1145 naturally pushes the plasma 1145 upward by buoyancy force.

The gas pocket 1176 surrounds the HV electrode 1174 near the bottom of the liquid vessel 1182, generating plasma arc discharge 1145 in the liquid vessel 1182. Accordingly, UV radiation and reactive species are generated from the plasma discharge and remain inside the liquid vessel 1182. The reactive species include OH, O, $O_3$, $H_2O_2$, and NON. Since most reactive species have a short half-life (on the order of milliseconds or less), except for ozone ($O_3$) and hydrogen peroxide ($H_2O_2$), it is beneficial to generate these reactive species near the liquid or inside the liquid such that the reactive species make direct contact with liquid molecules as the reactive species are generated. Another major benefit of the use of reverse vortex flow 1179 with the HV electrode 1174 at the bottom 1182B of the liquid vessel 1182 is that heat is not accumulated around the HV electrode 1174, reducing erosion of the HV electrode 1174. Furthermore, the gas pocket 1176 surrounds the HV electrode 1174, thus preventing liquid from making contact with the HV electrode 1174. Note that if the HV electrode 1174 makes contact with liquid for more than about 0.5 s, then a short circuit occurs between the two electrodes, and the plasma will extinguish. Thus, it is preferable to have the HV electrode 1174 surrounded by gas at all times. The direction of reverse vortex flow of liquid 1179 can be in either clockwise or counterclockwise direction as viewed from above, with a clockwise direction shown in FIG. 11B.

Figure 11D:
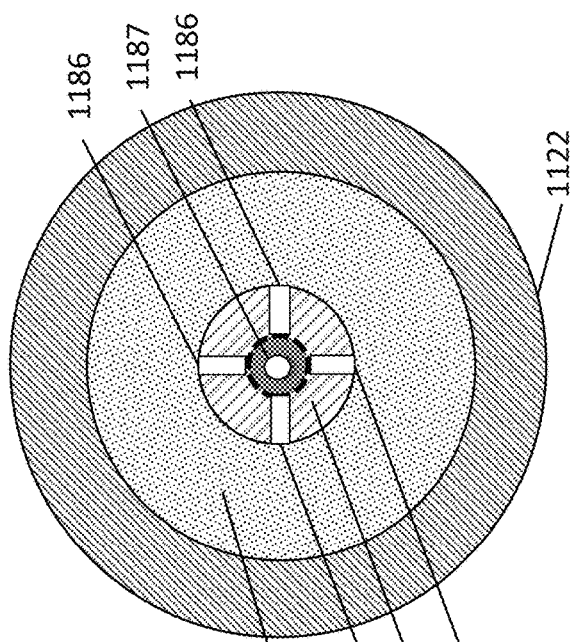
FIGS. 11D and 11E are top cut-away views showing schematic diagrams of co-axial electrode geometry including radial and tangential lateral openings in a high voltage electrode, respectively, in accordance with one or more embodiments.
Figure 11E:
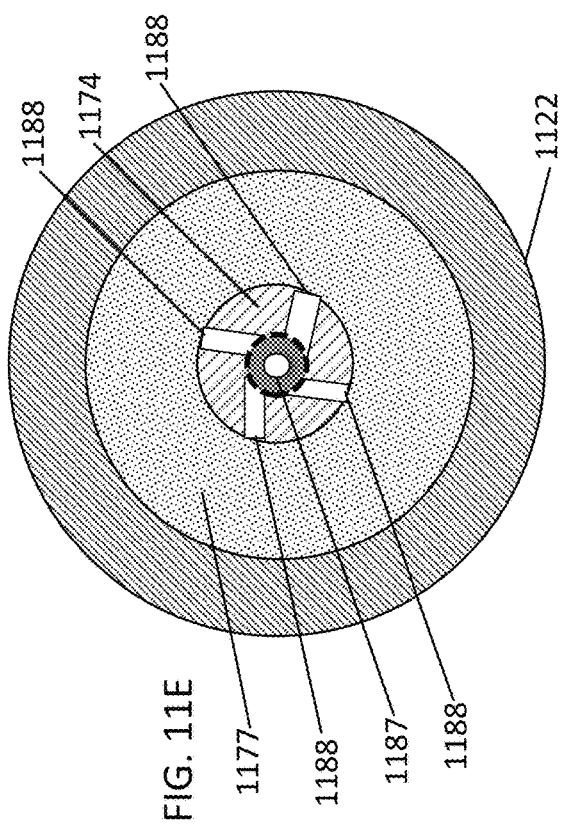
Figure 11C:
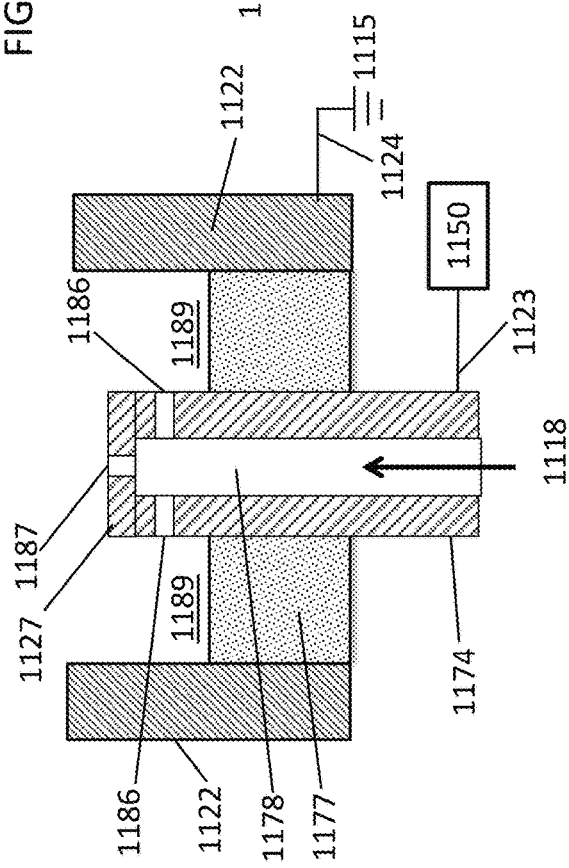
FIG. 11C is a side view showing a schematic diagram of a co-axial electrode geometry in accordance with one or more embodiments.

As described above, with reference now to FIGS. 11C, 11D, and 11E, illustrating details of the co-axial electrode geometry shown in FIG. 11A, both the HV 1174 and ground 1122 electrodes are made of metal in cylindrical geometries, with the ground electrode 1122 disposed coaxially around the HV electrode 1174. The HV electrode 1174 is connected to HV power supply 1150 via a connecting wire 1123. Insulating material 1177 (e.g., Teflon, glass-filled Teflon, sapphire, or ceramic) is used along the length of the HV electrode 1174 between the two metal electrodes 1174 and 1122 to separate them electrically. Accordingly, the insulating material 1177 also has a cylindrical tube geometry. The HV electrode 1174 is a hollow metal tube, such that compressed gas 1118 can pass through the gas channel 1178. Optionally, as shown in FIG. 11C, the top of the HV electrode 1174 is blocked by an endcap 1127, while the sidewall of the HV electrode 1174 proximal to the endcap 1127 has small lateral openings 1186 (e.g., 4, 6, 8, 10, 12, 14, or 16 lateral openings) for discharging compressed gas 1118. In one embodiment, the diameter of the lateral openings is 3 mm. As shown in FIGS. 11C, 11D, and 11E, the HV electrode 1174 optionally includes a central opening 1187 in the endcap 1127, with a diameter suitable for discharging compressed gas, such as 3 mm. FIG. 11D shows four lateral openings 1186 positioned along the radial direction in the sidewall of the HV electrode 1174. Alternatively, lateral openings 1188 can be made at an inclined angle, shown in FIG. 11E, so that the compressed gas 1118 exits the HV electrode 1174 tangentially, generating a swirling vortex gas flow inside the space 1189 between the HV 1174 and ground 1122 electrodes, shown in FIG. 11C. As compressed gas 1118 enters the gas channel 1178, the gas first fills the space 1189 between the HV 1174 and ground 1122 electrodes and then rises toward the top of the liquid vessel 1182 (indicated by a dashed arrow 1176B inside the low-pressure zone 1176A in FIGS. 11A and 12A), exiting the liquid vessel 1182 with liquid through the liquid outlet 1134.

In another reverse vortex flow system 1200 for generating a plasma discharge in liquid, shown in FIGS. 12A and 12B, the liquid vessel 1282 has the HV electrode 1274 and ground electrode 1275 spaced apart, positioned at opposite sides of the liquid vessel 1282, such that the HV electrode 1274 is disposed at the bottom side 1282B and the ground electrode 1275 is disposed at the top 1282T of the liquid vessel 1282. The HV electrode 1274 is connected to the HV power supply 1250 via the electrical connecting line 1223, whereas the ground electrode 1275 is connected to a ground source 1215 via the electrical connecting line 1224. Insulating material 1277 (e.g., Teflon, glass-filled Teflon, sapphire, or ceramic) is used along the length of the HV electrode 1274, that is a hollow metal tube, such that compressed gas 1218 can pass through the gas channel 1278. Optionally, as shown in FIG. 12A, the top of the HV electrode 1274 is blocked by an endcap 1227, while the sidewall of the HV electrode 1274 proximal to the endcap 1227 has small lateral openings 1286 (e.g., 4, 6, 8, 10, 12, 14, or 16 lateral openings) for discharging compressed gas 1218. In one embodiment, the diameter of the lateral openings is 3 mm. As also shown in FIG. 12A, the HV electrode 1274 optionally includes a central opening 1287 in the endcap 1227, with a diameter suitable for discharging compressed gas, such as 3 mm. The number, diameter, and orientation of the lateral openings 1286 and the central opening 1287 are similar to those described above with reference to the reverse vortex flow system 1100.

Since the liquid inlet 1233 and the liquid outlet 1234 are disposed near the top 1282T of the liquid vessel 1282, with the liquid outlet 1234 disposed at the center of the top side 1282T of the liquid vessel 1282 and the liquid inlet 1233 disposed tangentially relative to a sidewall 1282S of the liquid vessel 1282, as shown in FIG. 12B, the liquid forms a reverse vortex flow 1279 inside the liquid vessel 1282. The reverse vortex liquid flow 1279 moves along the outer edge of the liquid vessel 1282, moving downward as indicated by the dashed arrow 1279A, and creating an extended low-pressure zone 1276A at the center of the liquid vessel 1282, as shown schematically in FIG. 12A. As the centrifugal force produced by the reverse vortex flow 1279 creates the low-pressure zone 1276A at the center of the liquid vessel 1282, compressed gas 1218 that is injected into the liquid vessel 1282 from the bottom through the gas channel 1278 fills the low-pressure zone 1276A, creating a gas pocket 1276, shown in FIG. 12B, that rises toward the top of the liquid vessel 1282 (indicated by the dashed arrow 1276B shown in FIG. 12A). An important feature of the liquid vessel 1282 with the reverse vortex flow 1279 is that the low-pressure zone 1276A extends all the way to the top of the liquid vessel 1282. The gas pocket 1276 surrounds the HV electrode 1274 near the bottom of the liquid vessel 1282, generating plasma arc discharge 1245 in the liquid vessel 1282. One of the main advantages of having the two electrodes 1274 and 1275 at opposite sides of the liquid vessel 1282 is that the distance between the two electrodes 1274 and 1275 is greatly increased compared to the co-axial geometry shown in FIG. 11A. For the treatment of liquid with a very high electric conductivity (i.e., an electric conductivity in excess of 100 mS/cm), such as produced water or landfill leachate, the increased distance between the two electrodes provides a large impedance, which is helpful in igniting and stabilizing the plasma discharge.

When high-voltage plasma discharge is used for the treatment of liquid (e.g., water, wastewater, seawater, produced water, landfill leachate, etc.), there is often a technical challenge in a mismatch between the size of the plasma discharge and the volume of liquid. For example, the plasma discharge in liquid is a point source, whereas the volume of liquid is very large (i.e., in excess of 1,000 gallons a day). In addition, the contaminants in the liquid (i.e., organic and inorganic chemicals, microorganisms, dissolved metal ions, toxic and carcinogenic molecules, hydrocarbons, etc.) are dispersed in the liquid volume. Therefore, it is desirable to have a system where liquid makes a direct and close contact with the point-source plasma discharge for an efficient treatment. Since liquid in the liquid vessel moves spirally down to the bottom of the liquid vessel before it makes a sharp turn upward, the bottom of the liquid vessel is an ideal location for a plasma discharge to be positioned, as shown in FIGS. 11A and 12A, such that the liquid makes a direct and close contact with the plasma discharge for efficient treatment of the liquid.

However, the physical properties of the liquid to be treated can vary widely. For example, wastewater can be contaminated with a large number of suspended particles, organics and/or ions, making it a thick slurry with a high density and viscosity. When the density and viscosity of the liquid increase well beyond those of water, the rotating velocity inside the liquid vessel decreases, and thus the centrifugal force needed to move the liquid down to the bottom of the liquid vessel is diminished. In this case, 100% of the liquid does not move down to the bottom of the liquid vessel. Instead, some part of the liquid entering the liquid vessel through the liquid inlet moves directly toward the liquid outlet at the top of the liquid vessel. Therefore, in order to cause substantially all of the liquid to be treated to move down to the bottom of the liquid vessel, in accordance with one or more embodiments, a system 1210 for generating a plasma discharge in liquid, shown in FIG. 12C, includes a center tube extension 1235 of the liquid outlet 1234 into the interior space of the liquid vessel 1282, with a gap 1230 between the center tube 1235 and the insulator 1277 around the HV electrode 1274. The size of the gap 1230 is adjusted as a function of the flowrate of liquid. For example, when the liquid vessel 1282 optimized for a liquid flowrate of 30 gpm has an inside diameter of 2.3", the center tube 1235 can have an internal diameter of, for example, 1.25", and the gap 1230 is 0.3". The gap can be adjusted to accommodate the flowrate of liquid. For example, the gap should increase with increasing liquid flowrate in order to avoid excessive pressure drop. The center tube 1235 can be made of insulating material, such as PVC, or, alternatively, can be made of a conductive material, and form a part of the ground electrode 1275. In one embodiment, as shown in FIG. 13, the center tube 1335 can be coated on the inside and/or outside with a photocatalyst 1340, such as titanium dioxide ($TiO_2$).

Figure 14A:
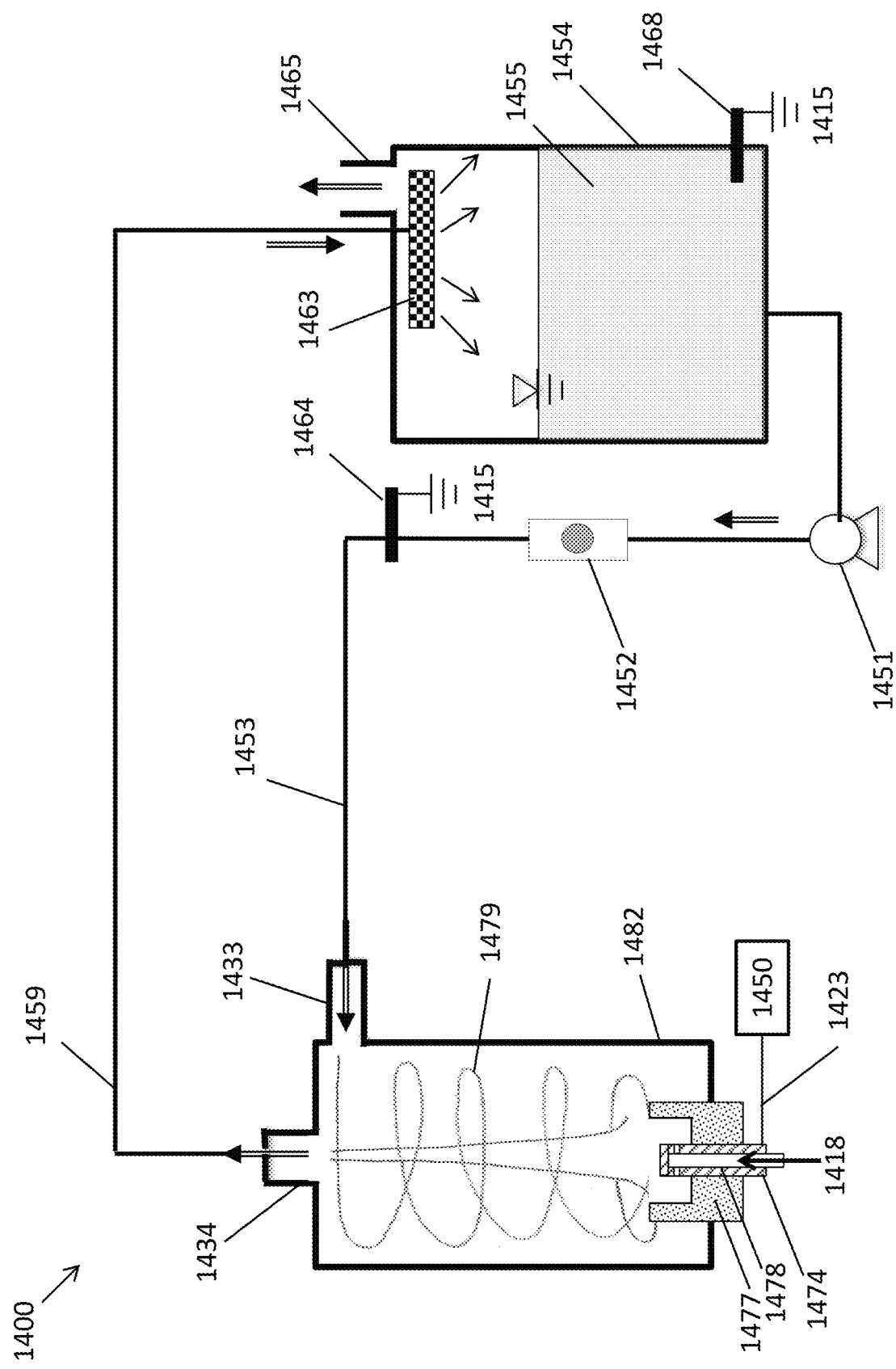
FIG. 14A is a side view showing a schematic diagram of a system for generating a plasma discharge in liquid including liquid circulation in accordance with one or more embodiments.

In accordance with one or more embodiments, FIG. 14A shows a schematic diagram of an embodiment of a system 1400 for generating plasma discharge in liquid including liquid circulation, where a liquid reservoir 1454, a circulation pump 1451, a flow meter 1452, a liquid vessel 1482, and a spray nozzle 1463 are used for the plasma treatment of liquid. The HV electrode 1474 is connected to the HV power supply 1450 via the electrical connecting line 1423. Insulating material 1477 (e.g., Teflon, glass-filled Teflon, sapphire, or ceramic) is used along the length of the HV electrode 1474, that is a hollow metal tube, such that compressed gas 1418 can pass through the gas channel 1478. Since the liquid inlet 1433 and the liquid outlet 1434 are disposed near the top of the liquid vessel 1482, with the liquid outlet 1434 disposed at the center of the top side of the liquid vessel 1482 and the liquid inlet 1433 disposed tangentially relative to a sidewall of the liquid vessel 1482, the liquid forms a reverse vortex flow 1479 inside the liquid vessel 1482. Liquid 1455 in the liquid reservoir 1454 is grounded with a ground electrode 1468 connected to a ground source 1415 for safe operation of the plasma treatment. The spray nozzle 1463 plays the important function of providing electrical insulation between returning liquid from the liquid vessel 1482 and the liquid 1455 in the liquid reservoir 1454. With the use of the spray nozzle 1463, the liquid in the liquid vessel 1482 and the liquid 1455 in the liquid reservoir 1454 are electrically separated, preventing plasma discharge in the liquid reservoir 1454. The gas coming into the liquid reservoir 1454 through the return pipe 1459 can be vented through the gas outlet 1465 or sent to a scrubber (not shown).

FIG. 14A also shows a ground electrode 1464 connected to a ground source 1415 and disposed upstream of the liquid inlet 1433 in fluid communication with the liquid in a pipe 1453 that connects the outlet of the flow meter 1452 and the inlet 1433 of liquid of the liquid vessel 1482. Having a ground electrode 1464 out of the liquid vessel 1482 and positioning it in the pipe 1453 provides a great flexibility in the generation of plasma discharge as the distance between the HV electrode 1474 and the ground electrode 1464 is directly related to the resistance (i.e., impedance), and thus affects the plasma generation. This flexibility is useful for treating a very high electrical conductivity liquid such as produced water and landfill leachate.

Figure 14B:
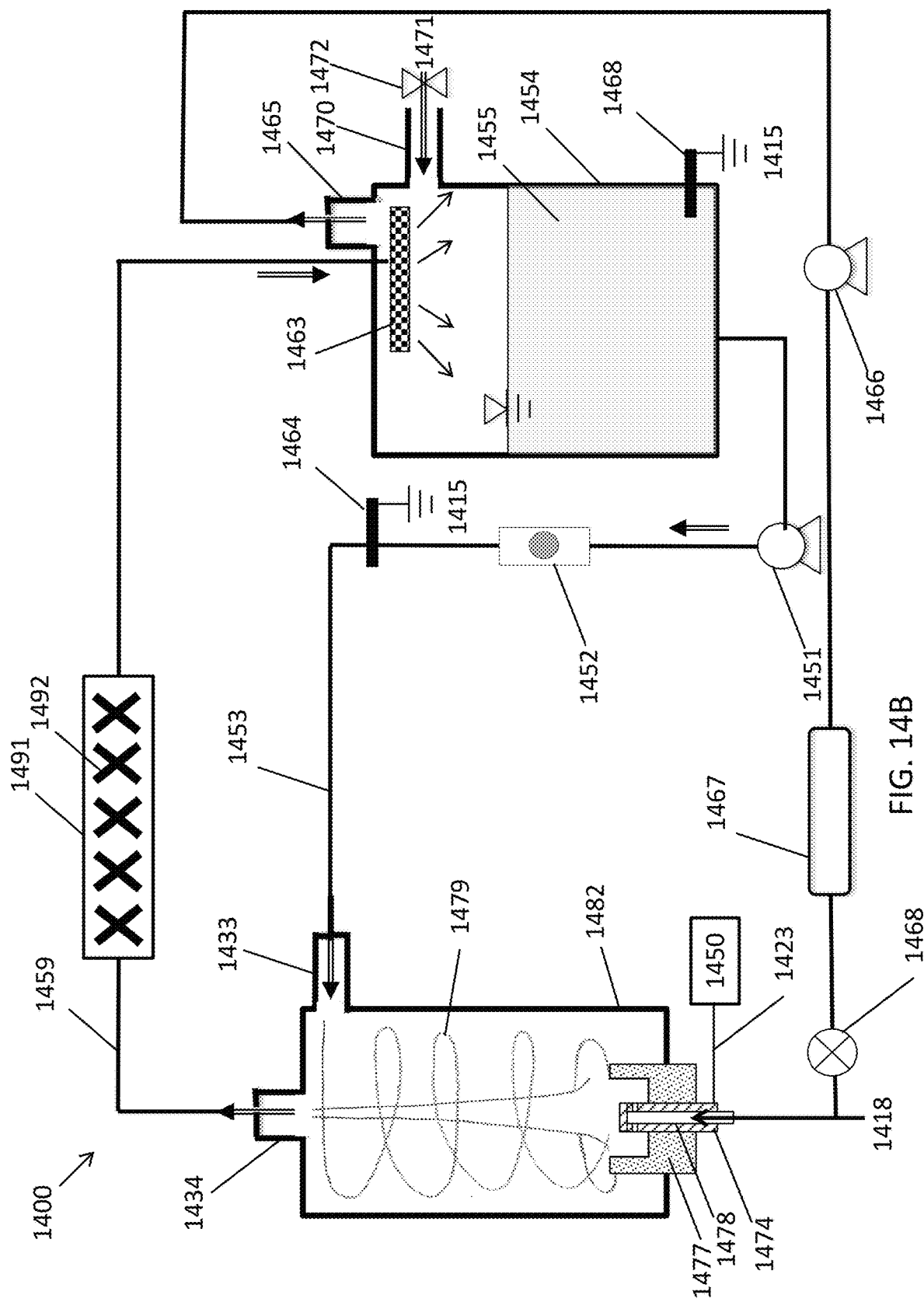
FIG. 14B is a side view showing a schematic diagram of a system for generating a plasma discharge in liquid including liquid circulation, liquid-gas mixing, and gas recompression in accordance with one or more embodiments.

FIG. 14B is another schematic diagram of the system 1400 including liquid circulation, where a liquid-gas mixing device 1491 is used. The gas exiting the liquid vessel contains active plasma species such as $H_2O_2$. However, the gas exiting the liquid vessel 1482 is in the form of a gas stream rather than bubbles because of the unique arrangement of reverse vortex flow 1479 inside the liquid vessel 1482. Hence, there is a need to break the gas stream to small gas bubbles such that gas and liquid can make better contact with each other. FIG. 14B shows a series of baffles 1492 in the liquid-gas mixing device 1491, which break the gas stream into small gas bubbles and thus greatly enhance the probability of contact between the gas and liquid. The system 1400 also includes a gas inlet 1470 for supplying gas 1471 into the liquid reservoir 1454 through check valve 1472. FIG. 14B also shows the gas outlet 1465 connected to a compressor 1466, a compressed outgas tank 1467, and an on/off valve 1468 for mixing the gas with the compressed gas 1418 and recycling it into the gas channel 1478.

Figure 15:
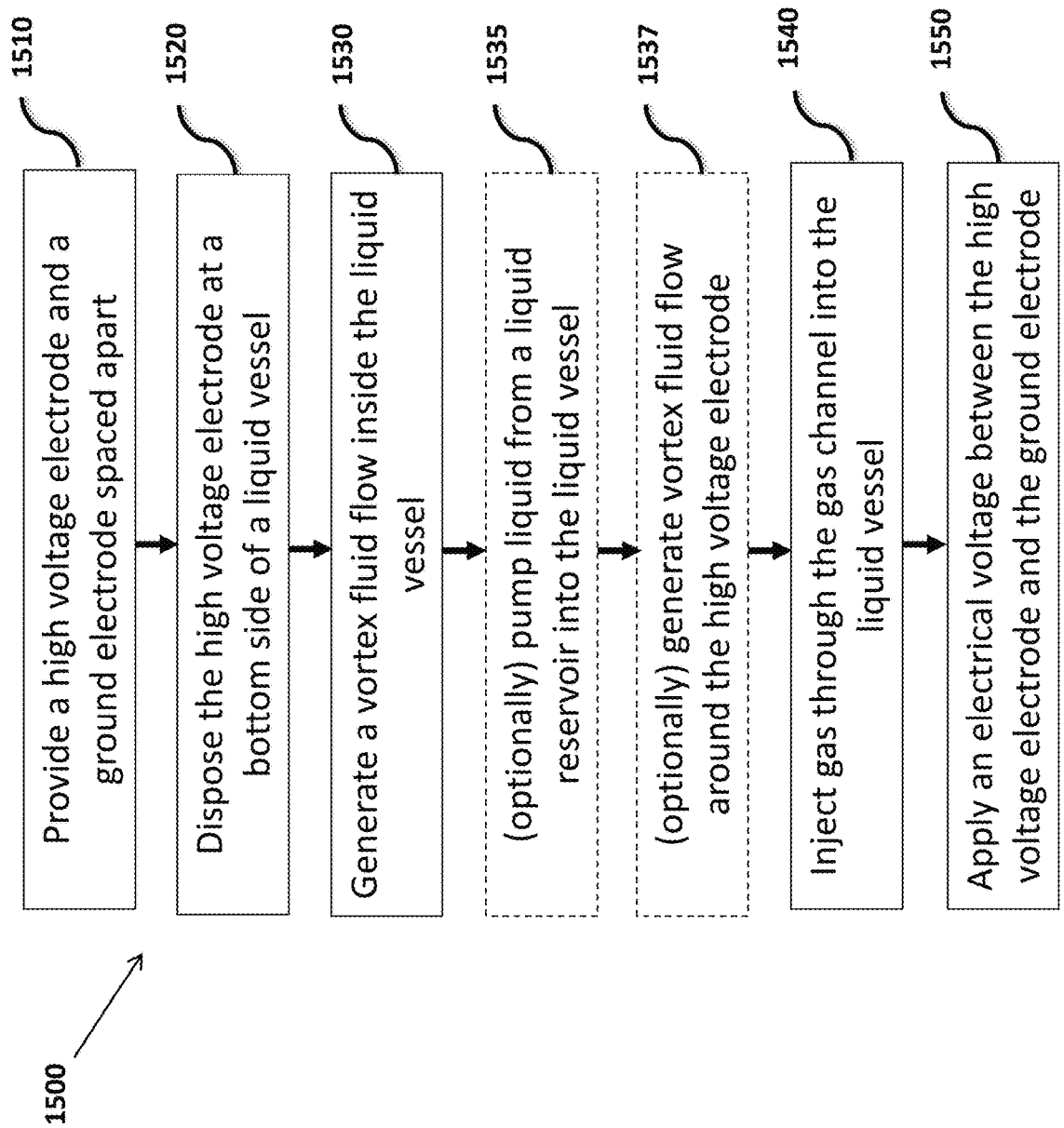
FIG. 15 is a flow chart of a method of generating a plasma discharge in liquid in accordance with one or more embodiments.

In accordance with one or more embodiments, a method 1500 of generating a plasma discharge in liquid, shown in FIG. 15, includes providing 1510 a high voltage electrode and a ground electrode spaced apart, disposing 1520 the high voltage electrode at a bottom side of a liquid vessel, the high voltage electrode including a gas channel, generating 1530 a vortex fluid flow inside the liquid vessel, injecting 1540 gas through the gas channel into the liquid vessel, and applying 1550 an electrical voltage between the high voltage electrode and the ground electrode to generate a plasma discharge in the liquid vessel. In some embodiments, generating 1530 the vortex fluid flow inside the liquid vessel can include pumping 1535 liquid from a liquid reservoir through a liquid inlet into the liquid vessel and out through a liquid outlet out of the liquid vessel. In certain embodiments, the method can further include generating 1537 the vortex fluid flow around the high voltage electrode.

The embodiments disclosed herein provide numerous benefits. One major benefit of the embodiments disclosed herein is that they provide a method to generate a plasma arc discharge in a cylindrical liquid vessel, where a large volume of water passes through at a flow rate in a range of between 10 gpm and 1000 gpm. Both forward and reverse vortex flows of liquid create a low-pressure zone at the center of the liquid vessel, which is extremely useful in the generation of plasma arc discharge in liquid. The low-pressure zone created by the forward and reverse vortex flows of liquid helps the arc discharge to expand as compressed gas pushes the arc from the small space between the two electrodes into the middle of the liquid vessel. Accordingly, the interface surface of the arc with liquid increases, and thus the contact between the arc and water increases, making the plasma treatment more efficient. Further, both forward and reverse vortex flows in the liquid vessel increase the residence time of water in the liquid vessel. Accordingly, the contact time between plasma arc and water, and thus the treatment time of water, increases. In addition, both forward and reverse vortex flows become stronger with increasing liquid flow rate. Thus, the low-pressure zone at the center of the liquid vessel increases with increasing liquid flow rate. Hence, the present method of creating an arc discharge is an ideal method for plasma treatment at a large liquid flow rate. In other words, the present application of forward and reverse vortex flows can be scaled up to very large flow applications.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention.

What is claimed is:

1. A system for generating a plasma discharge in liquid, the system comprising:
   a liquid inlet and a liquid outlet in fluid communication with an interior space of a liquid vessel, the inlet and outlet both disposed near a top side of the liquid vessel and configured to generate a vortex fluid flow in the interior space of the liquid vessel; and
   a high voltage electrode and a ground electrode spaced apart, the high voltage electrode i) disposed at a bottom side of the liquid vessel, ii) including a gas channel for gas injection into the liquid vessel, and iii) including an endcap and a plurality of lateral openings in a sidewall of the high voltage electrode proximal to the endcap.

2. The system of claim 1, further including a liquid reservoir in fluid communication with the interior space of the liquid vessel and a pump that pumps liquid between the liquid reservoir and the liquid vessel.

3. The system of claim 2, further including a liquid spray nozzle in the liquid reservoir, the liquid spray nozzle in fluid communication with the liquid outlet.

4. The system of claim 1, wherein the liquid inlet is disposed tangentially relative to a sidewall of the liquid vessel to generate the vortex fluid flow in the interior space.

5. The system of claim 4, wherein the liquid outlet is disposed at a center of the top side of the liquid vessel to generate a reverse vortex fluid flow in the interior space.

6. The system of claim 5, further including an insulator around the high voltage electrode, and a center tube extension of the liquid outlet into the interior space of the liquid vessel, with a gap between the center tube and the insulator.

7. The system of claim 6, wherein the insulator is one of Teflon, glass-filled Teflon, sapphire, or ceramic.

8. The system of claim 6, further including a photocatalyst coating on the center tube.

9. The system of claim 8, wherein the photocatalyst is titanium dioxide ($TiO_2$).

10. The system of claim 1, wherein the ground electrode is disposed in the interior space of the liquid vessel.

11. The system of claim 10, wherein the ground electrode is disposed coaxially around the high voltage electrode.

12. The system of claim 11, further including an insulator between the high voltage electrode and the ground electrode, along a length of the high voltage electrode.

13. The system of claim 12, wherein the insulator is one of Teflon, glass-filled Teflon, sapphire, or ceramic.

14. The system of claim 10, wherein the ground electrode is disposed at the top side of the liquid vessel.

15. The system of claim 1, wherein the endcap includes a central opening.

16. The system of claim 1, wherein the lateral openings are disposed radially in the sidewall of the gas channel.

17. The system of claim 1, wherein the lateral openings are disposed tangentially in the sidewall of the gas channel.

18. A system for generating a plasma discharge in liquid, the system comprising:
a liquid inlet and a liquid outlet in fluid communication with an interior space of a liquid vessel the inlet and outlet both disposed near a top side of the liquid vessel and configured to generate a vortex fluid flow in the interior space of the liquid vessel; and
a high voltage electrode and a ground electrode spaced apart, the high voltage electrode i) disposed at a bottom side of the liquid vessel, ii) including a gas channel for gas injection into the liquid vessel, and iii) an endcap and a plurality of lateral openings in a sidewall of the high voltage electrode proximal to the endcap, and the ground electrode disposed upstream of the liquid inlet in fluid communication with the liquid.

19. The system of claim 18, wherein the endcap includes a central opening.

20. The system of claim 18, wherein the lateral openings are disposed radially in the sidewall of the high voltage electrode.

21. The system of claim 18, wherein the lateral openings are disposed tangentially in the sidewall of the high voltage electrode.

22. The system of claim 18, further including an insulator around the high voltage electrode and a center tube extension of the liquid outlet into the interior space of the liquid vessel, with a gap between the center tube and the insulator.

23. The system of claim 22, wherein the insulator is one of Teflon, glass-filled Teflon, sapphire, or ceramic.

24. The system of claim 22, further including a photocatalyst coating on the center tube.

25. The system of claim 24, wherein the photocatalyst is titanium dioxide ($TiO_2$).

* * * * *